(12) United States Patent
Kwon et al.

(10) Patent No.: US 10,522,350 B2
(45) Date of Patent: Dec. 31, 2019

(54) METHOD OF FABRICATING THREE-DIMENSIONAL SEMICONDUCTOR DEVICES

(71) Applicant: Samsung Electronics Co., Ltd., Suwon-si, Gyeonggi-do (KR)

(72) Inventors: Yong-Hyun Kwon, Hwaseong-si (KR); Daehyun Jang, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/808,993

(22) Filed: Nov. 10, 2017

(65) Prior Publication Data

US 2018/0330948 A1    Nov. 15, 2018

(30) Foreign Application Priority Data

May 10, 2017    (KR) ........................ 10-2017-0058204

(51) Int. Cl.
*H01L 21/033*    (2006.01)
*H01L 27/11582*    (2017.01)
(Continued)

(52) U.S. Cl.
CPC ...... *H01L 21/0337* (2013.01); *H01L 21/0332* (2013.01); *H01L 21/31144* (2013.01);
(Continued)

(58) Field of Classification Search
CPC ........... H01L 21/0337; H01L 21/31144; H01L 21/0332; H01L 27/11582
See application file for complete search history.

(56) References Cited

U.S. PATENT DOCUMENTS 7,467,632 B2    12/2008    Lee et al.
8,609,549 B2    12/2013    Lee et al.
(Continued)

FOREIGN PATENT DOCUMENTS

KR    10-0895375 B1    4/2009
KR    10-0983514 B1    9/2010

OTHER PUBLICATIONS

Sohn, et al. "Process Technology for Next Generation Photomask," Japanese Journal of Applied Physics, vol. 37, Part I, No. 12B, pp. 6668-6674 (1998).

*Primary Examiner* — Jay C Chang
*Assistant Examiner* — Mikka Liu
(74) *Attorney, Agent, or Firm* — Harness, Dickey & Pierce, P.L.C.

(57) ABSTRACT

A method of fabricating a three-dimensional semiconductor device comprises stacking first hardmask layers and second hardmask layers on a lower layer including a pattern region and a buffer region adjacent to the pattern region, the second hardmask layers and the first hardmask layers for forming a first hardmask pattern and a second hardmask pattern, patterning the second hardmask layer to form the second hardmask pattern including a plurality of first mask holes on the pattern region and at least one recess on the buffer region, the plurality of first mask holes exposing the first hardmask layer, and etching the first hardmask layer using the second hardmask pattern as an etch mask to form the first hardmask pattern including a plurality of etch mask holes on the pattern region and at least one buffer mask hole on the buffer region, the plurality of etch mask holes exposing a top surface of the lower layer, the at least one buffer mask hole having a bottom surface spaced apart from the top surface of the lower layer.

20 Claims, 22 Drawing Sheets

(51) Int. Cl.
*H01L 21/311* (2006.01)
*H01L 21/28* (2006.01)
*H01L 27/11565* (2017.01)

(52) U.S. Cl.
CPC .. *H01L 27/11565* (2013.01); *H01L 27/11582* (2013.01); *H01L 29/40117* (2019.08)

(56) References Cited

U.S. PATENT DOCUMENTS

| | | |
|---|---|---|
| 9,184,060 B1 | 11/2015 | Lee |
| 9,373,635 B2 | 6/2016 | Jung et al. |
| 9,425,072 B2 | 8/2016 | Sun et al. |
| 2012/0329224 A1* | 12/2012 | Kong ................. H01L 21/0332 438/268 |
| 2013/0164922 A1* | 6/2013 | Cho .................... H01L 21/308 438/510 |
| 2015/0372101 A1 | 12/2015 | Lee et al. |
| 2016/0071855 A1 | 3/2016 | Park et al. |
| 2017/0141161 A1* | 5/2017 | Sakotsubo ............ H01L 27/249 |

\* cited by examiner

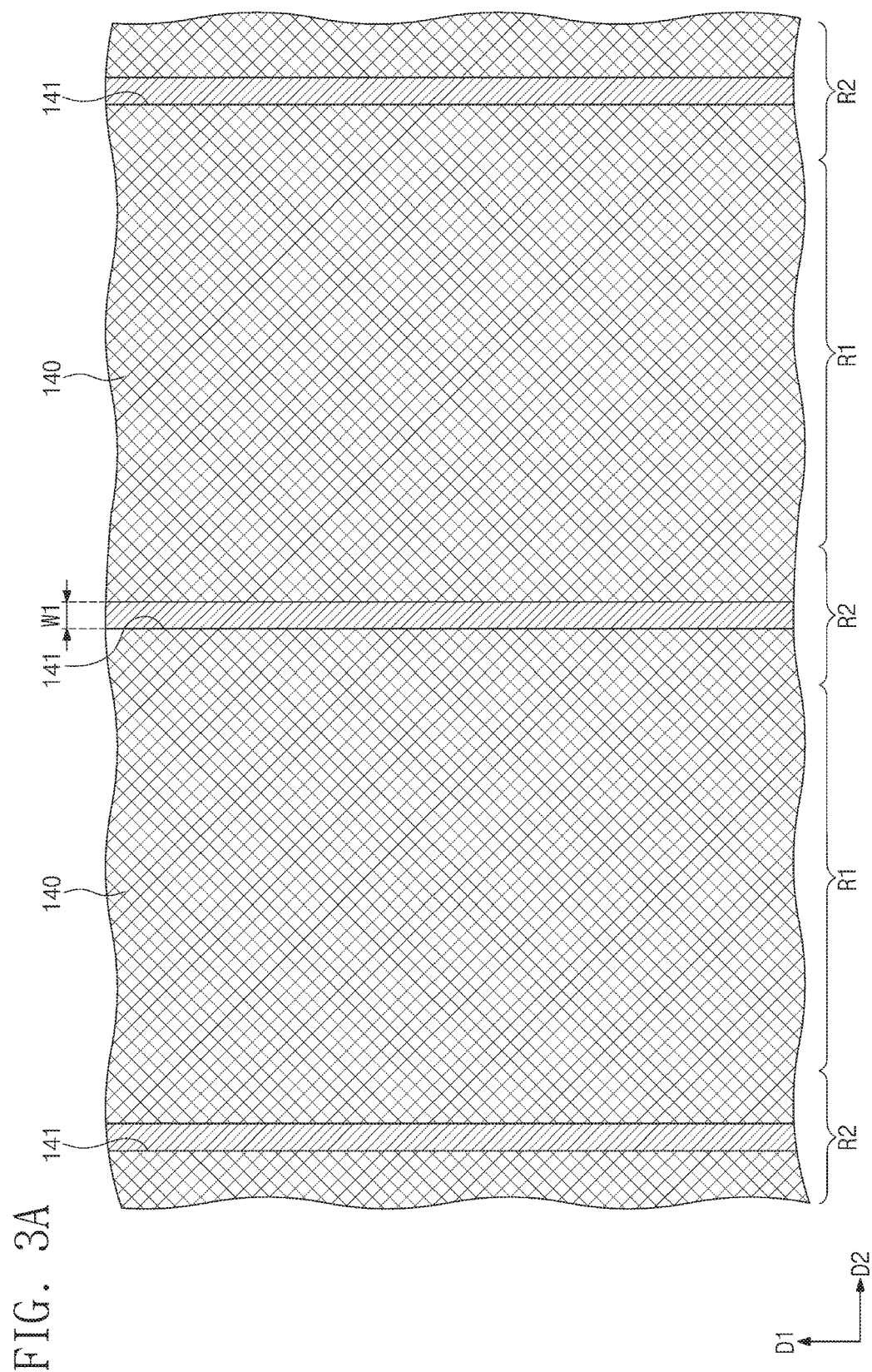

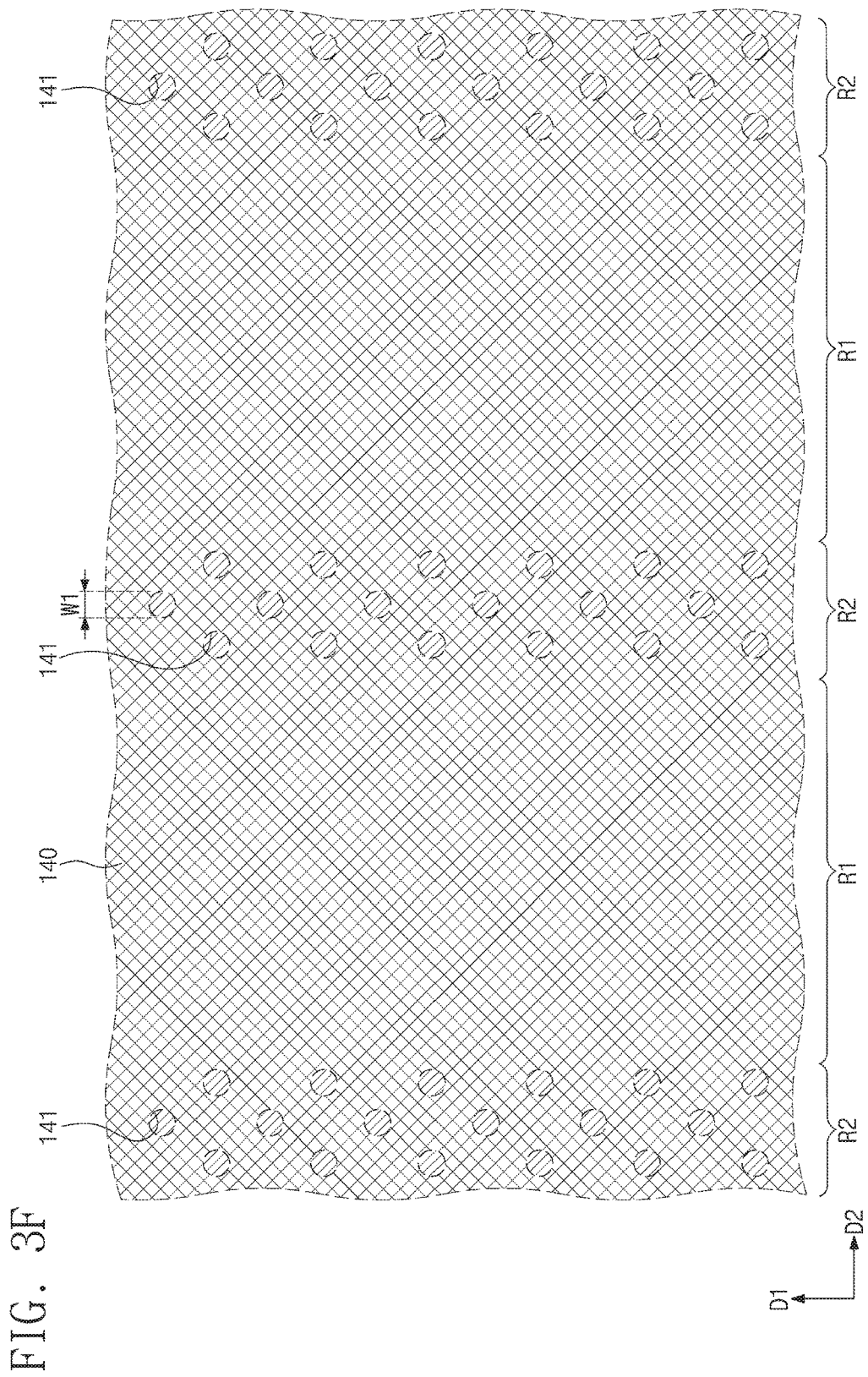

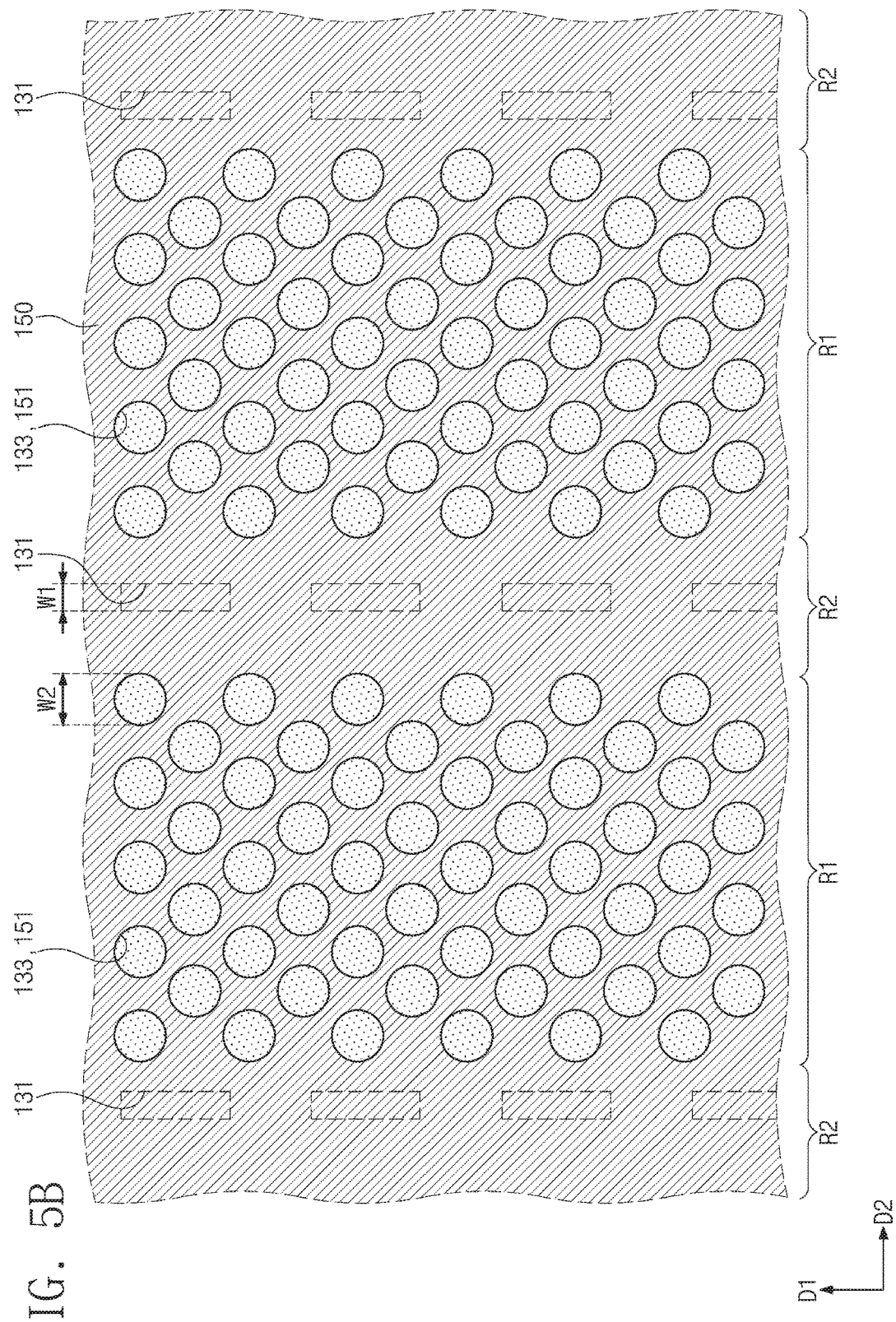

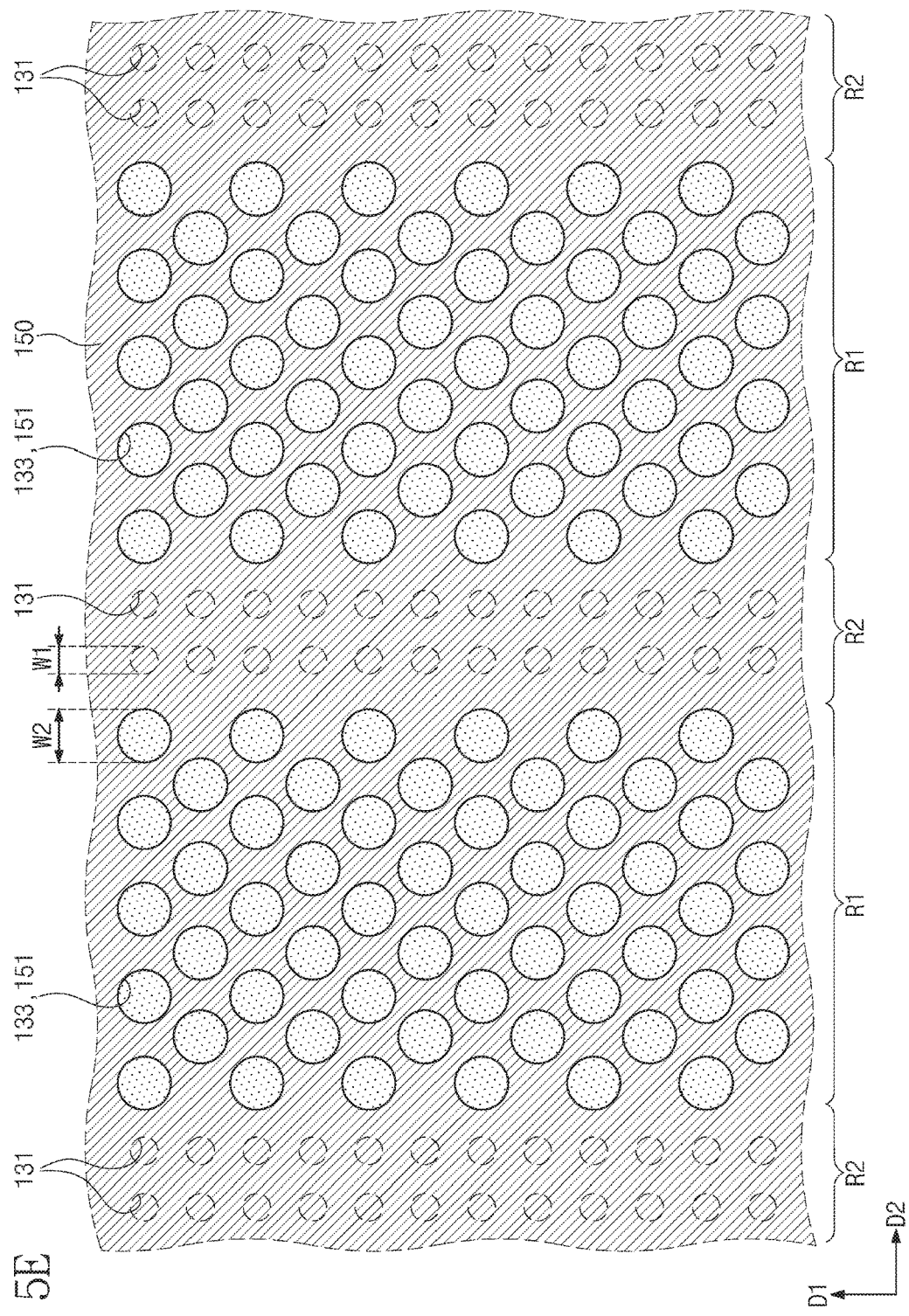

METHOD OF FABRICATING THREE-DIMENSIONAL SEMICONDUCTOR DEVICES

CROSS-REFERENCE TO RELATED APPLICATIONS

This U.S. nonprovisional patent application claims priority under 35 U.S.C. § 119 of Korean Patent Application No. 10-2017-0058204 filed on May 10, 2017, the entire contents of which are hereby incorporated by reference.

BACKGROUND

The disclosure relates to a method of fabricating a semiconductor device, and more particularly, to a method of fabricating a three-dimensional semiconductor device.

Semiconductor devices have been integrated for satisfying performance and manufacture costs which are desired by users. Since integration of the semiconductor devices is an important factor in determining product price, high integration is increasingly desired in particular. Integration of typical two-dimensional or planar semiconductor devices may be primarily determined by the area occupied by a unit memory cell, such that it is greatly influenced by the level of technology for forming fine patterns. However, expensive process equipment used to increase pattern fineness may set a practical limit on the increase of integration of the two-dimensional or planar semiconductor devices. Therefore, there have been proposed three-dimensional semiconductor memory devices having three-dimensionally arranged memory cells.

SUMMARY

Embodiments of inventive concepts provide a method of fabricating a three-dimensional semiconductor device having enhanced reliability.

An object of inventive concepts is not limited to the above-mentioned one, other objects which have not been mentioned above will be clearly understood to those skilled in the art from the following description.

According to example embodiments of inventive concepts, a method of fabricating a three-dimensional semiconductor device may comprise stacking first hardmask layers and second hardmask layers on a lower layer including a pattern region and a buffer region adjacent to the pattern region, the second hardmask layers and the first hardmask layers for forming a first hardmask pattern and a second hardmask pattern, patterning the second hardmask layer to form the second hardmask pattern including a plurality of first mask holes on the pattern region and at least one recess on the buffer region, the plurality of first mask holes exposing the first hardmask layer, and etching the first hardmask layer using the second hardmask pattern as an etch mask to form the first hardmask pattern including a plurality of etch mask holes on the pattern region and at least one buffer mask hole on the buffer region, the plurality of etch mask holes exposing a top surface of the lower layer, the at least one buffer mask hole having a bottom surface spaced apart from the top surface of the lower layer.

According to example embodiments of inventive concepts, a method of fabricating a three-dimensional semiconductor device may comprise providing a substrate including pattern regions and a buffer region between the pattern regions, forming a thin-layer structure on the substrate, the thin-layer structure comprising sacrificial layers and insulation layers alternately and vertically stacked, forming a first hardmask pattern on the thin-layer structure, the first hardmask pattern including at least one buffer mask hole on the buffer region and a plurality of etch mask holes on each of the pattern regions, the at least one buffer mask hole having a bottom surface spaced apart from a top surface of the thin-layer structure, the plurality of etch mask holes exposing the top surface of the thin-layer structure, and anisotropically etching the thin-layer structure using the first hardmask pattern as an etch mask.

According to example embodiments of inventive concepts, a method of fabricating a three-dimensional semiconductor device may comprise stacking first and second hardmask layers on a lower layer including pattern regions and a buffer region between the pattern regions, forming a first mask pattern on the second hardmask layer, the first mask pattern including first openings on the buffer region, etching a portion of the second hardmask layer using the first mask pattern as an etch mask to form a recession, removing the first mask pattern, forming a second mask pattern on the second hardmask layer, the second mask pattern filling the recess and including second openings on the pattern regions, etching the second hardmask layer using the second mask pattern as an etch mask to form first mask holes, and etching the first hardmask layer to form etch mask holes exposing the lower layer on the pattern regions, the second hardmask layer including the recess and the first mask holes being used as an etch mask when etching the first hardmask layer.

BRIEF DESCRIPTION OF THE DRAWINGS

FIGS. 3A to 3F illustrate plan views of a first mask pattern shown FIG. 2 used in a method of fabricating a three-dimensional semiconductor memory device according to example embodiments of invent concepts.

FIGS. 5A to 5F illustrate plan views of a second mask pattern shown in FIG. 4 used in a method of fabricating a three-dimensional semiconductor memory device according to example embodiments of inventive concepts.

DETAILED DESCRIPTION OF EMBODIMENTS

It will be hereinafter discussed in detail a method of fabricating a three-dimensional semiconductor device according to example embodiments of inventive concepts in conjunction with the accompanying drawings.

Figure 1:
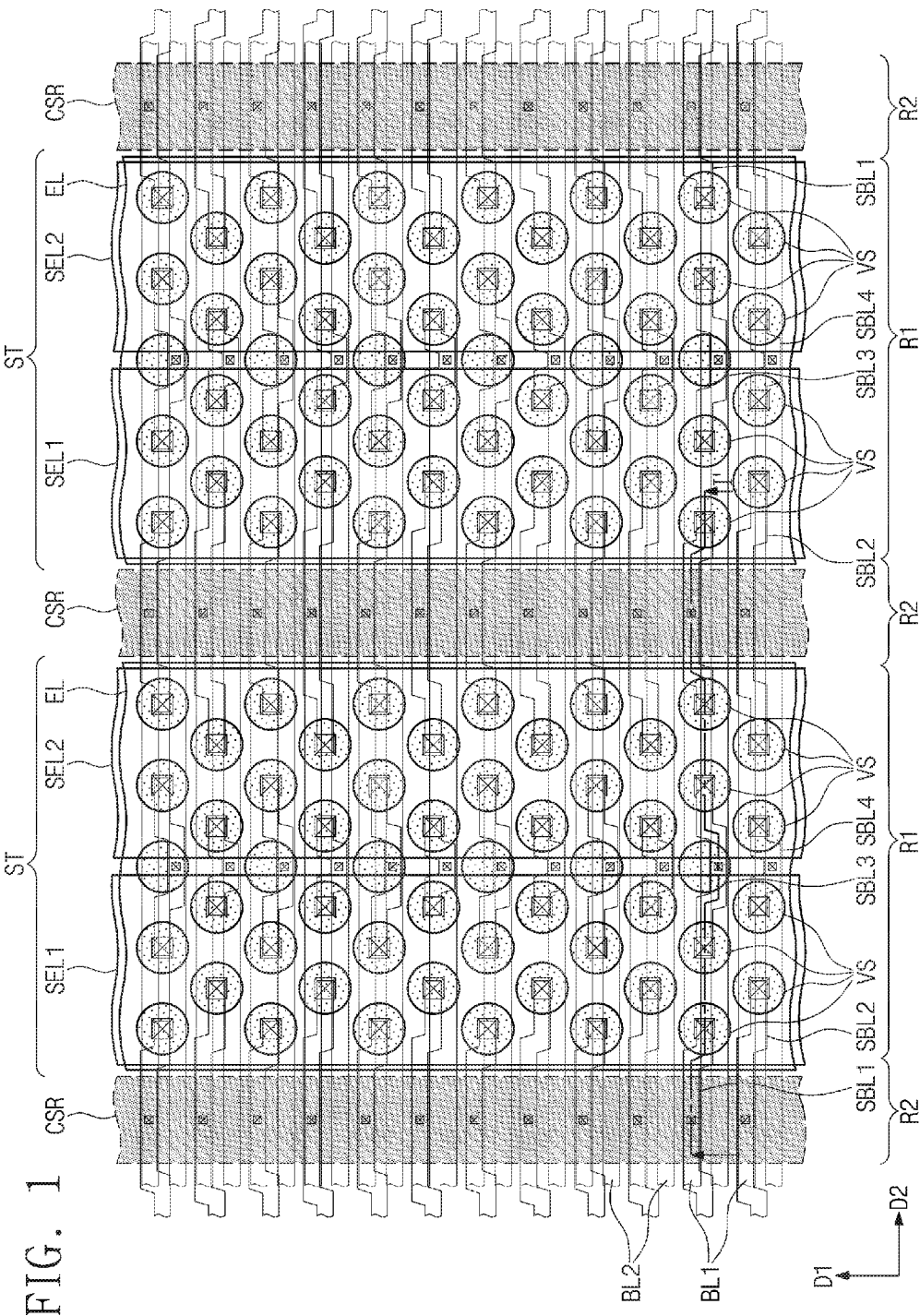
FIG. 1 illustrates a plan view showing a cell array of a three-dimensional semiconductor memory device according to example embodiments of inventive concepts.

FIG. 1 illustrates a plan view showing a cell array of a three-dimensional semiconductor memory device according to example embodiments of inventive concepts. FIGS. 2, 4, and 6 to 12 illustrate cross-sectional views taken along line I-I' of FIG. 1, showing a method of fabricating a three-dimensional semiconductor memory device according to example embodiments of inventive concepts.

Figure 2:
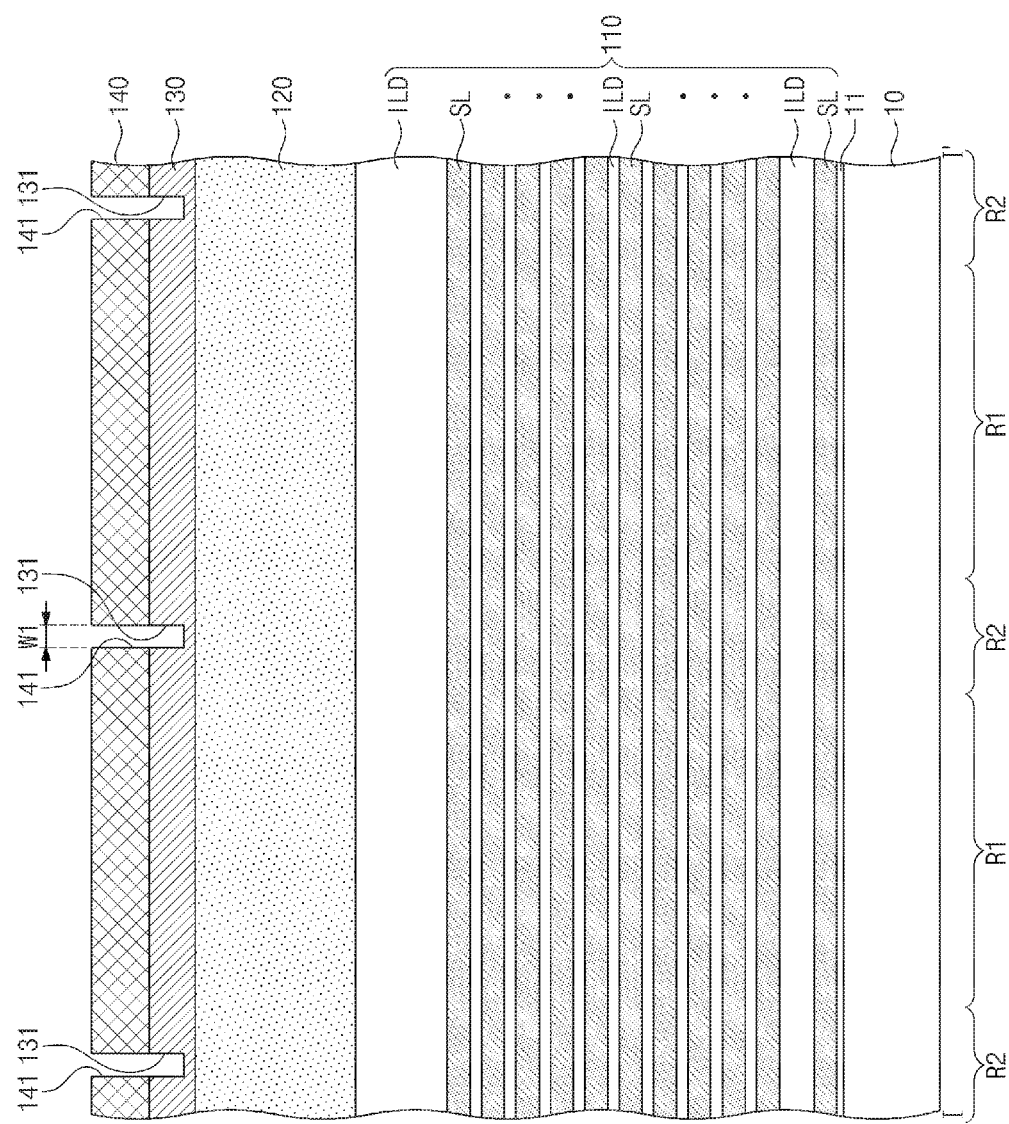
FIGS. 2, 4, and 6 to 12 illustrate cross-sectional views taken along line of FIG. 1, showing a method of fabricating a three-dimensional semiconductor memory device according to example embodiments of inventive concepts.

FIGS. 3A to 3F illustrate plan views of a first mask pattern shown in FIG. 2 used in a method of fabricating a three-dimensional semiconductor memory device according to example embodiments of inventive concepts.

Figure 4:
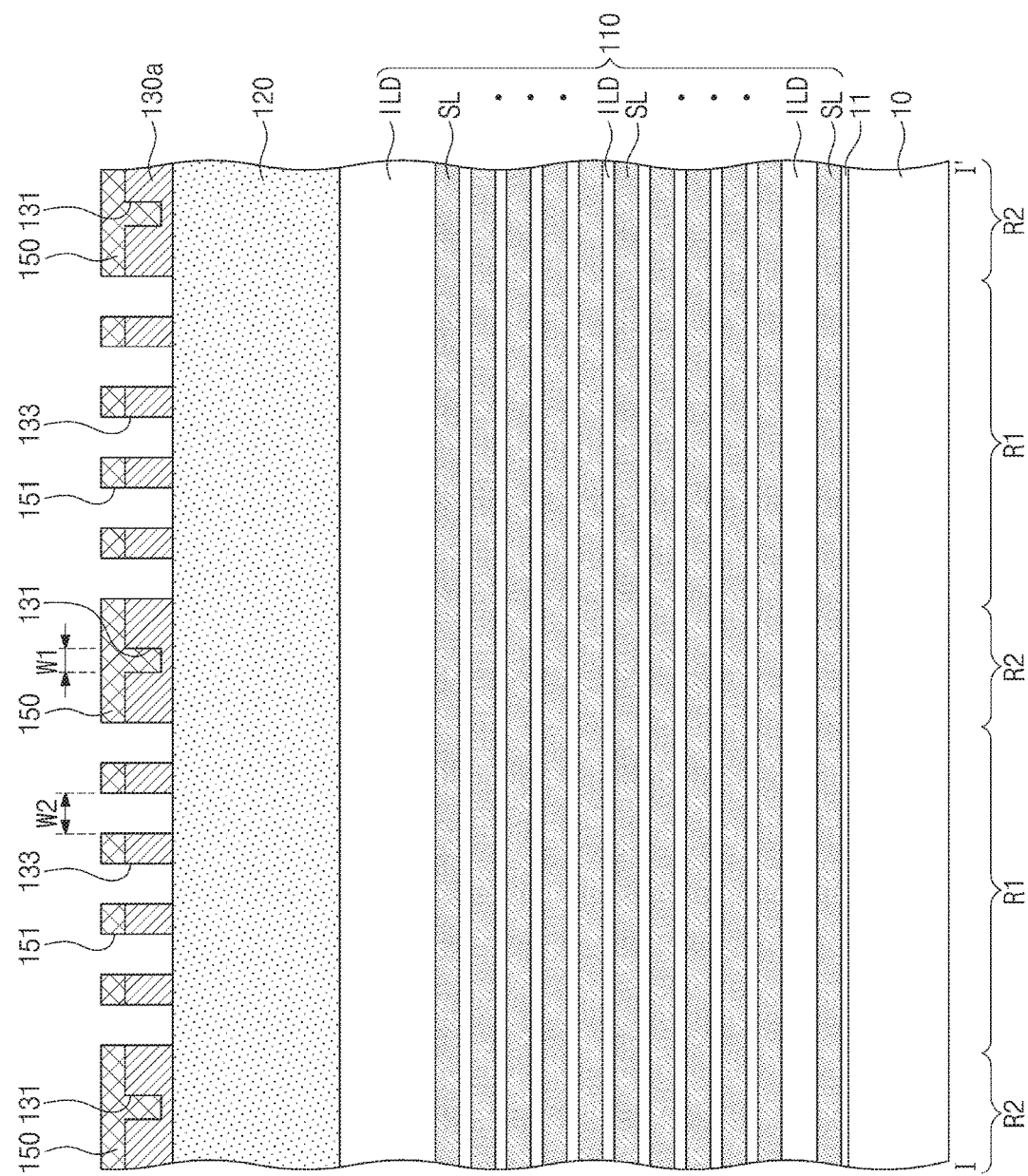
Figure 5A:
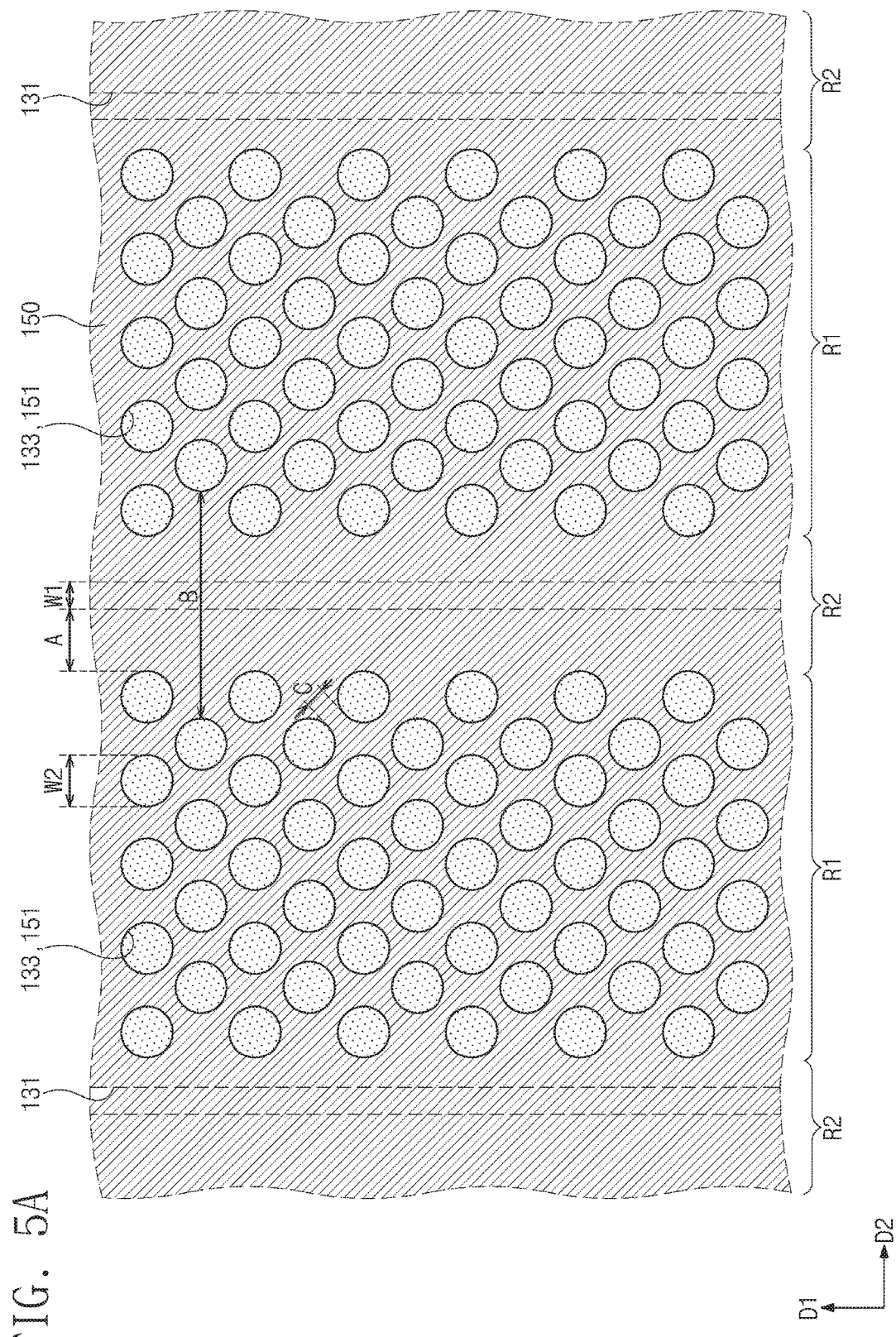
Figure 5C:
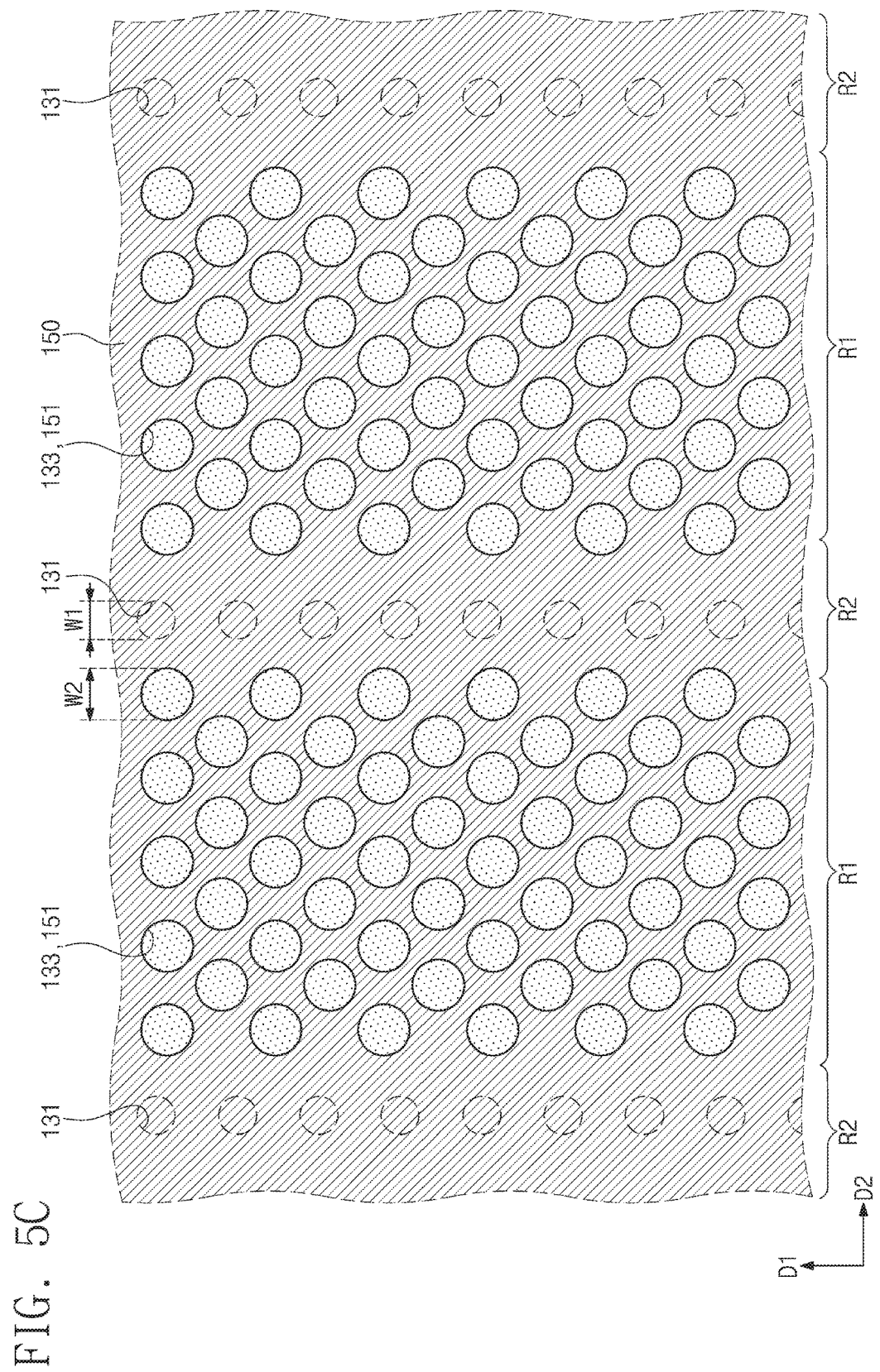
Figure 5D:
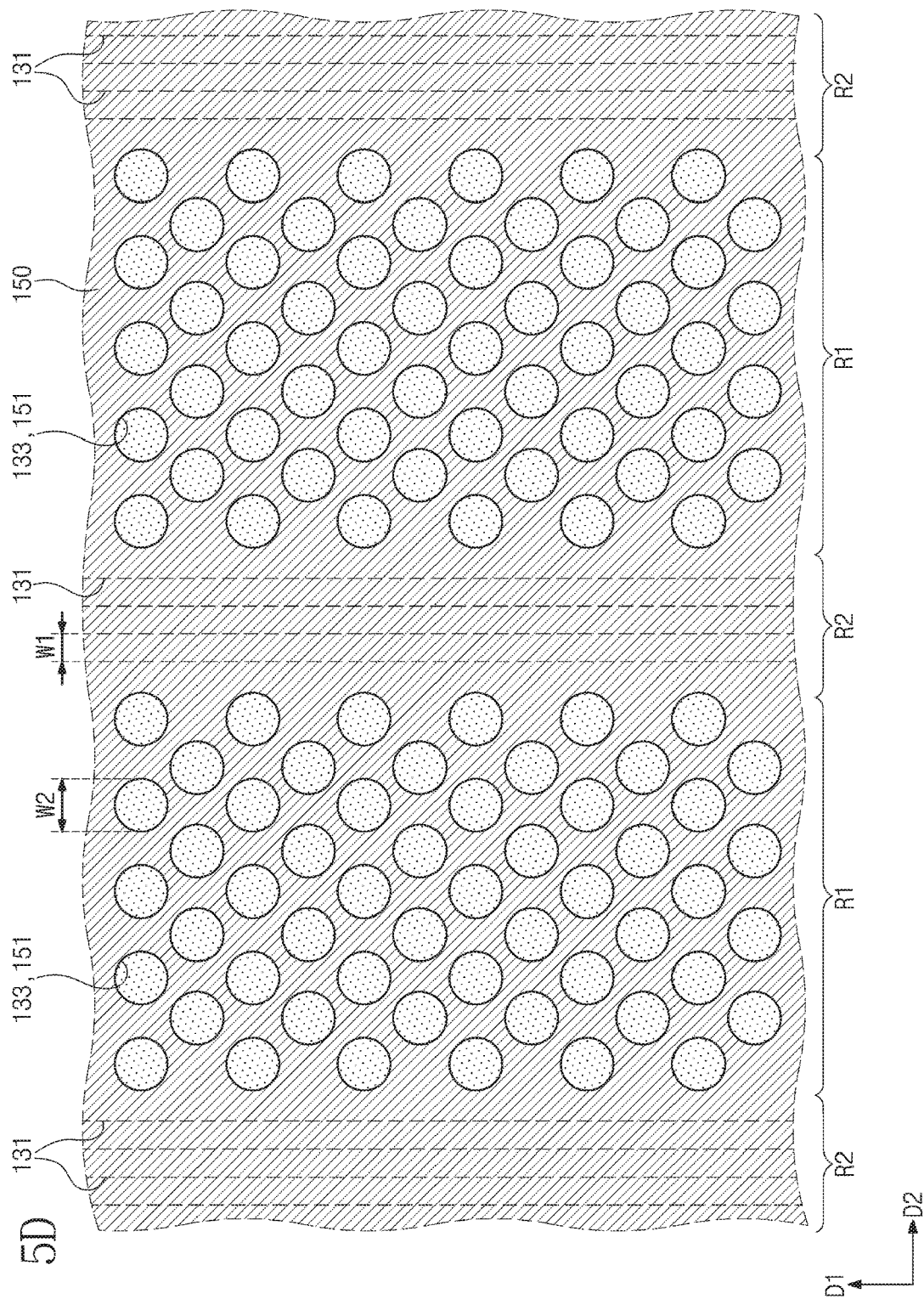
Figure 5F:
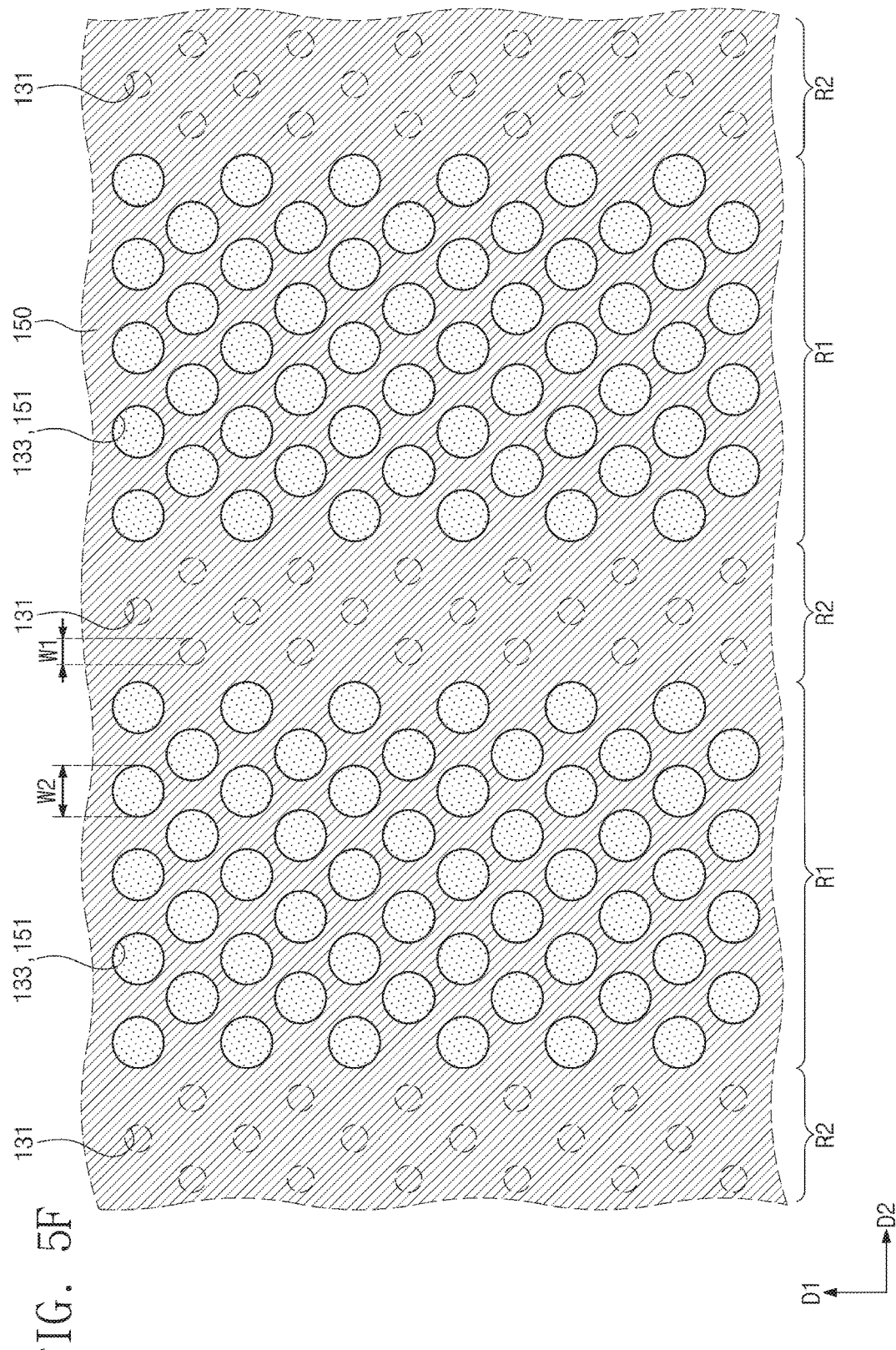

FIG. 5A to 5F illustrate plan views of a second mask pattern shown in FIG. 4 used in a method of fabricating a three-dimensional semiconductor memory device according to example embodiments of inventive concepts.

Referring to FIGS. 1 and 2, a thin-layer structure 110 may be formed on a substrate 10. The thin-layer structure 110 may include sacrificial layers SL and insulation layers ILD, for example, that are alternately and repeatedly stacked. In some example embodiments, the thin-layer structure 110 may include pattern regions R1 and buffer regions R2 that are alternately disposed side by side. The pattern region R1 may have an area greater than that of the buffer region R2.

The substrate 10 may be or may include one of a material (e.g., silicon wafer) having semiconductor characteristics, an insulating material (e.g., glass), and semiconductor or conductor covered with an insulating material. For example, the substrate 10 may be a silicon wafer having a first conductive type.

The sacrificial layers SL may be formed of a material that can be etched with an etch selectivity to the insulation layers ILD. For example, the sacrificial layers SL and the insulation layers ILD may exhibit a high etch selectivity to a chemical solution for wet etching and a low etch selectivity to an etching gas for dry etching.

For example, the sacrificial layers SL and the insulation layers ILD may include insulating materials exhibiting different etch selectivities from each other. For example, the sacrificial layers SL may be formed of a silicon nitride layer, and the insulation layers ILD may be formed of a silicon oxide layer.

In some embodiments, the sacrificial layers SL may have substantially the same thickness, for example, the same thickness for each layer. Alternatively, a lowermost one of the sacrificial layers SL may be thicker than other ones of the sacrificial layers SL. Similarly, the insulation layers ILD may have the same or substantially the same thickness for each layer, or one or more of the insulation layers ILD may have a different thickness from other ones of the insulation layers ILD.

Before the thin-layer structure 110 is formed, a buffer insulation layer 11 may be formed covering a top surface of the substrate 10. The buffer insulation layer 11 may be or may include a silicon oxide layer formed by deposition or thermal oxidation.

In some example embodiments, the thin-layer structure 110 may have a vertical thickness, e.g. a height, that varies depending on integration of a semiconductor memory device. For example, the vertical thickness of the thin-layer structure 110 may be changed based on a number of stacks of the insulation layers ILD and the sacrificial layers SL.

After the thin-layer structure 110 is formed, channel holes may be formed on the pattern regions R1 penetrating the thin-layer structure 110. When the channel holes are formed, a mask structure that exhibits an etch selectivity, for example a good or excellent etch selectivity, to the thin-layer structure 110 having a large thickness may be desired. For example, after the thin-layer structure 110 is formed, the thin-layer structure 110 may be provided thereon with a first hardmask pattern that serves as an etch mask required for forming the channel holes penetrating the thin-layer structure 110. FIGS. 2 to 6 are referenced below to explain in detail the formation of the first hardmask pattern.

Referring to FIG. 2, first and second hardmask layers 120 and 130 may be stacked, e.g. sequentially stacked, on the thin-layer structure 110.

The first hardmask layer 120 may include a material exhibiting an etch selectivity to the thin-layer structure 110 in a process for etching the thin-layer structure 110. The first hardmask layer 120 may be formed using chemical vapor deposition and/or spin-on-coating. The first hardmask layer 120 may have a thickness that varies depending on the thickness of the thin-layer structure 110.

The first hardmask layer 120 may include a silicon-containing material such as silicon oxide, silicon nitride, silicon oxynitride, or polysilicon; a carbon-containing material such as an amorphous carbon layer (ACL) or a spin-on-hardmask (SOH) layer; a metal-containing material such as tungsten; or an organic material. The first hardmask layer 120 may be formed of or include, for example, an SOH layer or an amorphous carbon layer. The SOH layer may include a carbon-based SOH layer or a silicon-based SOH layer.

The second hardmask layer 130 may include a material exhibiting an etch selectivity to the first hardmask layer 120 in a process for etching the first hardmask layer 120. The second hardmask layer 130 may be formed, e.g. may be deposited, using chemical vapor deposition or spin-on-coating. The second hardmask layer 130 may be thinner than the first hardmask layer 120. The second hardmask layer 130 may include, for example, a silicon-containing material such as polysilicon, SiON, $SiO_2$, $Si_3N_4$, SiCN, and/or SiC.

A first mask pattern 140 may be formed on the second hardmask layer 130. The first mask pattern 140 may have first openings 141 provided on the buffer regions R2 of the thin-layer structure 110. For example, the first mask pattern 140 may be formed by coating on the second hardmask layer 130 a photoresist material to form a photoresist layer and then performing exposure and development processes on the photoresist layer.

In some example embodiments, the first opening 141 may have in a second direction D2 a first width W1, which may be less than a spacing distance in the second direction D2 between the first openings 141. For example, the first width W1 may be less than about one-fifth the spacing distance in the second direction D2 between the first openings 141.

According to the embodiment illustrated in FIG. 3A, the first openings 141 of the first mask pattern 140 may each have a linear shape extending in a first direction D1, and may be spaced apart from one another at a regular distance.

Figure 3B:
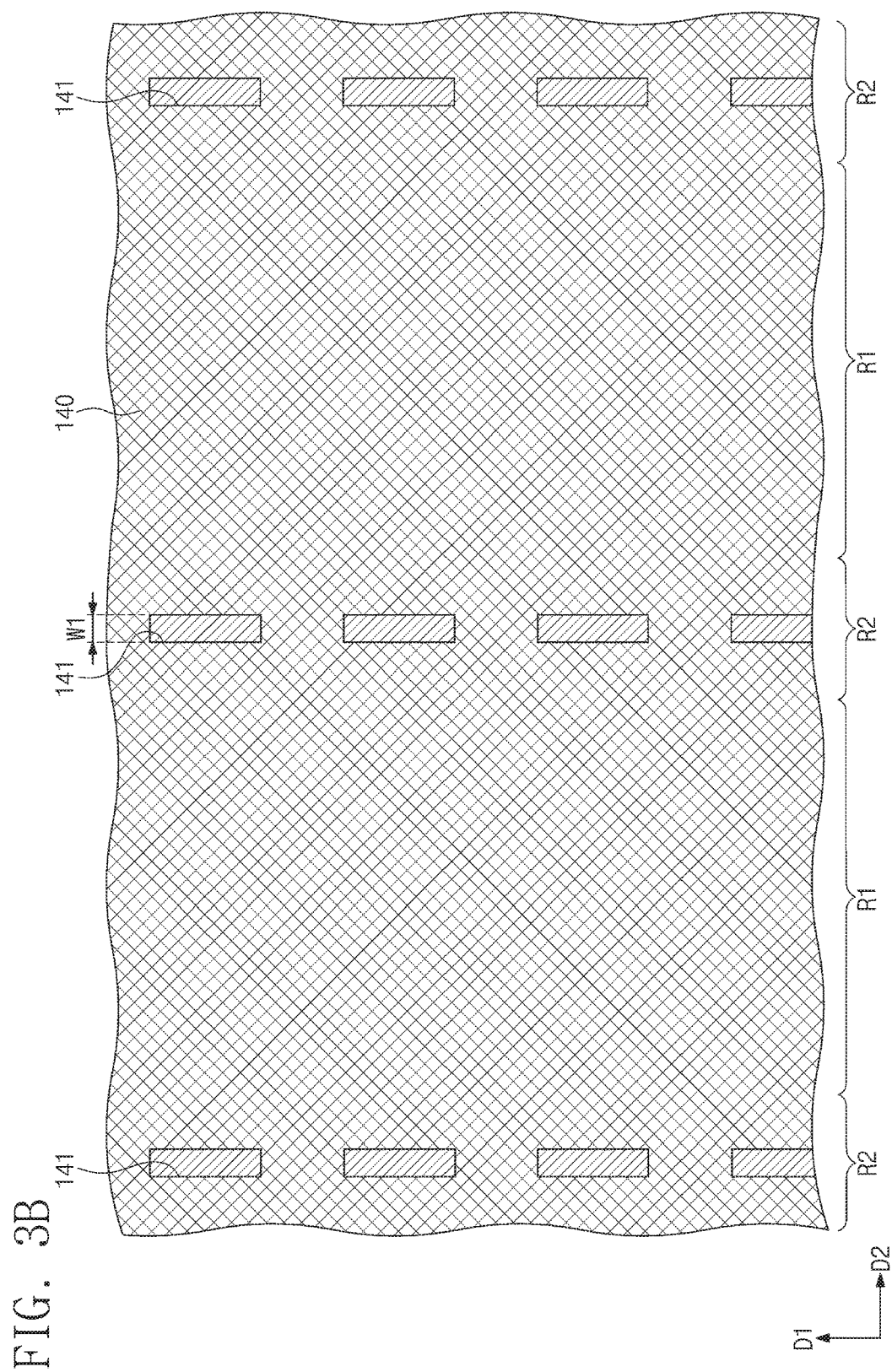

According to the embodiment illustrated in FIG. 3B, the first openings 141 of the first mask pattern 140 may each have or include a bar, rectangular, or elliptical shape that has a major axis in the first direction D1. The first openings 141 may be spaced apart from one another in the first and second directions D1 and D2. For example, the first openings 141 may be spaced apart in the second direction D2 at a second distance and in the first direction D1 at a first distance less than the second distance.

Figure 3C:
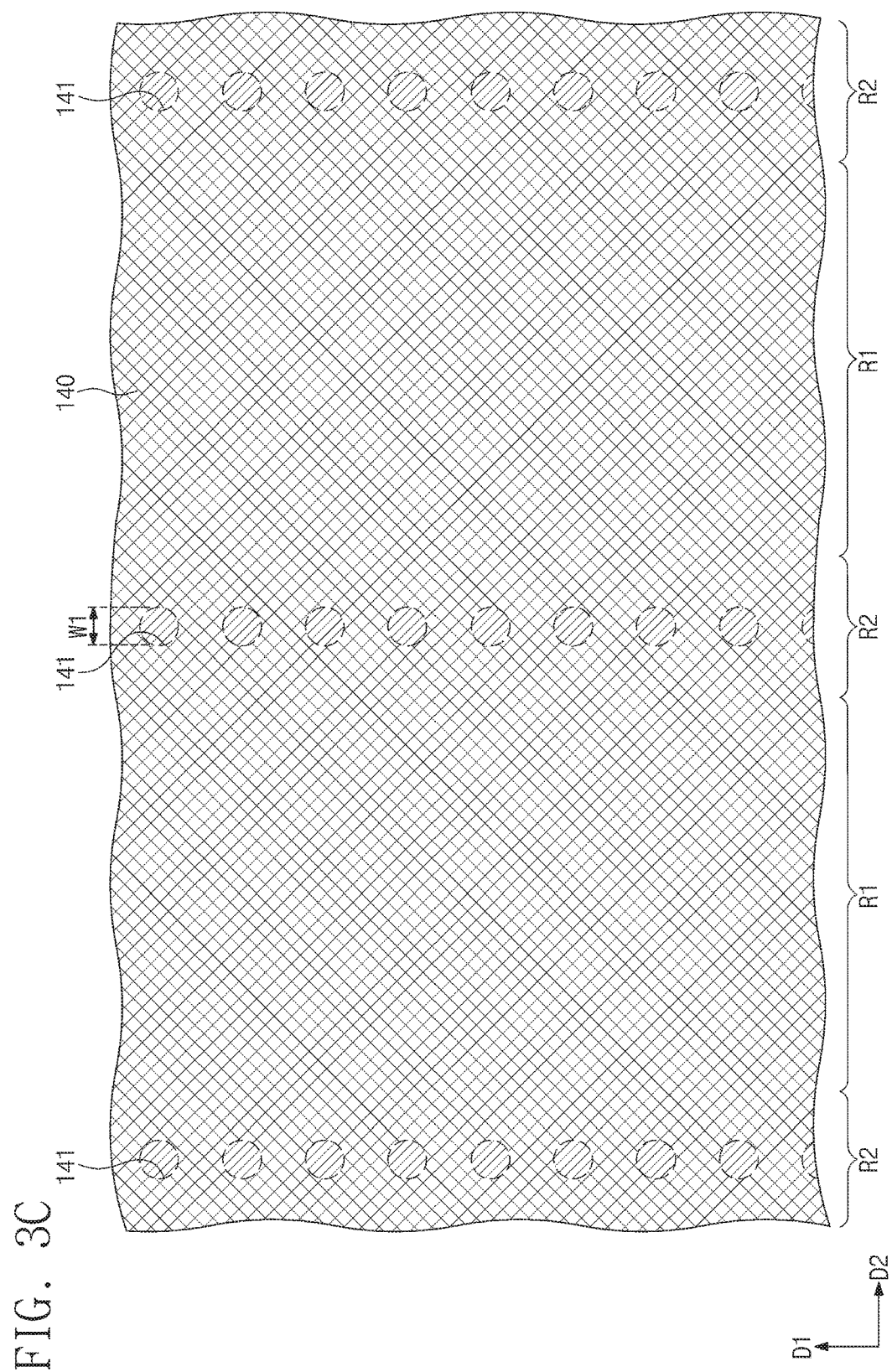

According to the example embodiment illustrated in FIG. 3C, the first openings 141 of the first mask pattern 140 may have circular shapes arrayed in a straight line, and may be arranged in columns that extend along the first direction D1 and are spaced apart from each other in the second direction D2.

Figure 3D:
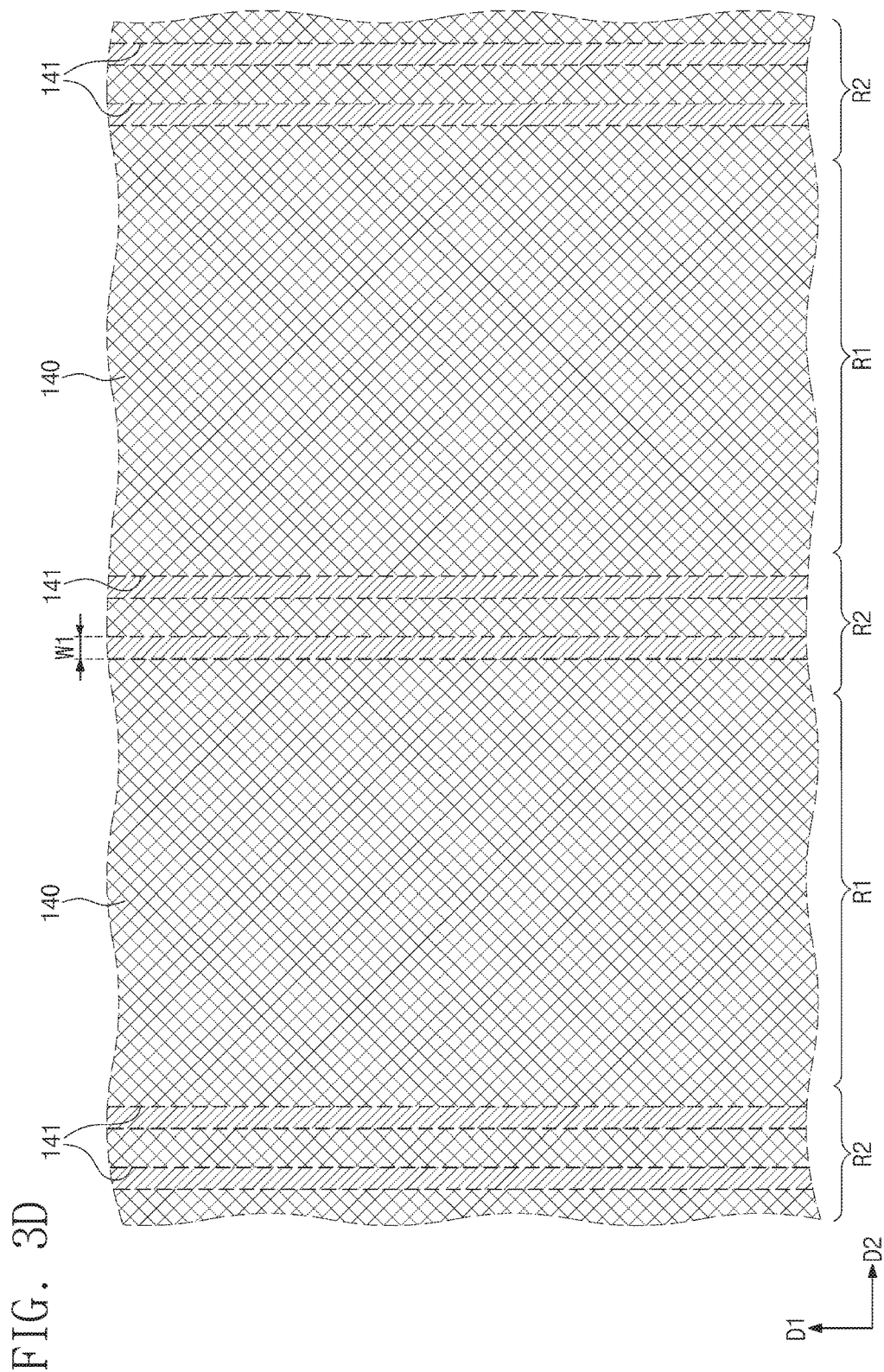

According to the example embodiment illustrated in FIG. 3D, the first openings 141 of the first mask pattern 140 may each have a linear shape extending in the first direction D1, and each of the buffer regions R2 may be provided with a plurality of the first openings 141 spaced apart from each other in the second direction D2.

Figure 3E:
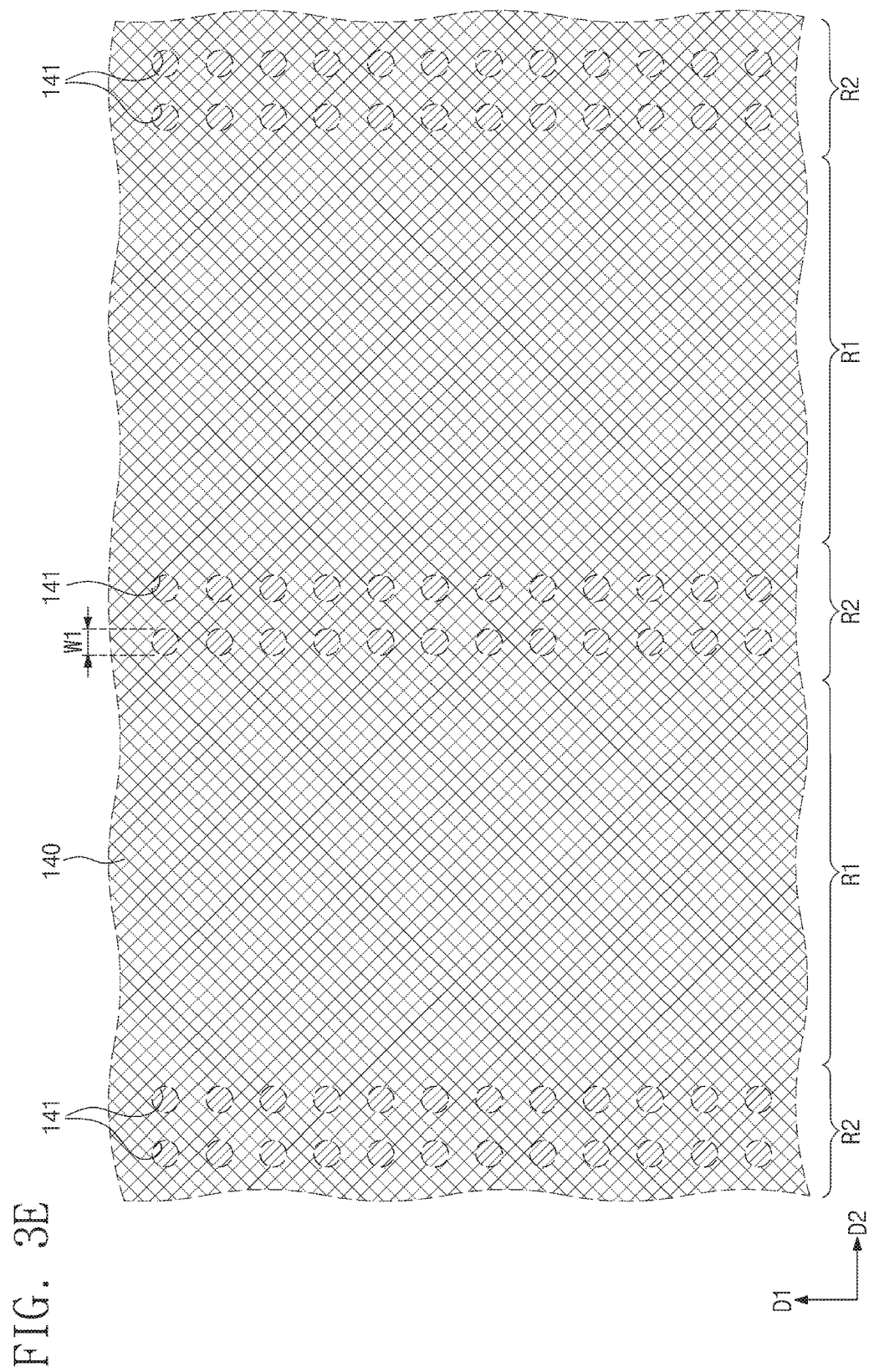

According to the example embodiment illustrated in FIG. 3E, the first openings 141 of the first mask pattern 140 may each have a circular shape, and each of the buffer regions R2 may be provided with a plurality of the first openings 141 arranged in columns, for example, two or three columns, that extend along the first direction D1. For example, the first openings 141 may be arranged in the first direction D1 which form a plurality of columns spaced apart from each other in the second direction D2.

According to the embodiment illustrated in FIG. 3F, the first openings 141 of the first mask pattern 140 may be arranged along the first direction D1 to constitute a column group including a plurality of columns, for example, first to third columns. The first openings 141 on the first column may be disposed diagonally to other first openings 141 on the second and third columns. For example, the column group may include the first openings 141 arranged in a zigzag fashion along the first direction D1.

Referring back to FIG. 2, the first mask pattern 140 having the first openings 141 may be used as an etch mask to partially etch the second hardmask layer 130, thereby forming recesses 131 on the second hardmask layer 130. The second hardmask layer 130 may be reduced in thickness at the recesses 131, and then portions of the second hardmask layer 130 may remain below the recesses 131. The recesses 131 may have various shapes identical or similar to those of the first openings 141 illustrated in FIGS. 3A to 3F. In some embodiments, the first width W1 of the first opening 141 may correspond to a first width in the second direction D2 of the recess 131.

After the recesses 131 are formed on the second hardmask layer 130, the first mask pattern 140 may be removed.

Referring to FIGS. 1 and 4, a second mask pattern 150 may be formed on the second hardmask layer 130 to fill the recesses 131. The second mask pattern 150 may have second openings 151 provided on the pattern regions R1 of the thin-layer structure 110. In some embodiments, the second openings 151 may each have a second width W2 in the second direction D2 greater than the first width W1 of the recess 131.

For example, the second mask pattern 150 may be formed by coating a photoresist material on the second hardmask layer 130 to form a photoresist layer and then performing exposure and development processes on the photoresist layer.

Referring to FIGS. 5A to 5F, on each pattern region R1, the second openings 151 may be arranged along the first direction D1 in a zigzag or matrix fashion. A single column may be made of at least a plurality of the second openings 151 spaced apart from each other in the first direction and each pattern region R1 may be provided with a plurality of the columns constituted by second openings 151. The number of the columns included in the second openings 151 arranged in the first direction D1 is not limited to that illustrated in figures. For example, on each pattern region R1, the number of the columns may be variously changed to be three, four, five, six, eight, eleven, twelve, or higher.

In a plan view each recess 131 and its most adjacent second opening 151 may be spaced apart at a distance A, which may be less than a maximum distance B between the second openings 151 adjacent to each other in the second direction D2. For example, the recess 131 having the first width W1 may be between the second openings 151 each of which has the second width W2 greater than the first width W1. The distance A between each recess 131 and its most adjacent second opening 151 may be the same or substantially the same as or greater than a distance C between the second openings 151 most adjacent to each other.

Referring back to FIG. 4, the second mask pattern 150 having the second openings 151 may be used as an etch mask during anisotropically etching the second hardmask layer 130, thereby forming a second hardmask pattern 130a having first mask holes 133. The first hardmask layer 120 may be exposed through the first mask holes 133 of the second hardmask pattern 130a In some embodiments, when the first mask holes 133 are formed, the first hardmask layer 120 may not be exposed on the buffer regions R2 because the recesses 131 are filled with the second mask pattern 150.

After the second hardmask pattern 130a is formed, the second mask pattern 150 may be removed.

Figure 6:
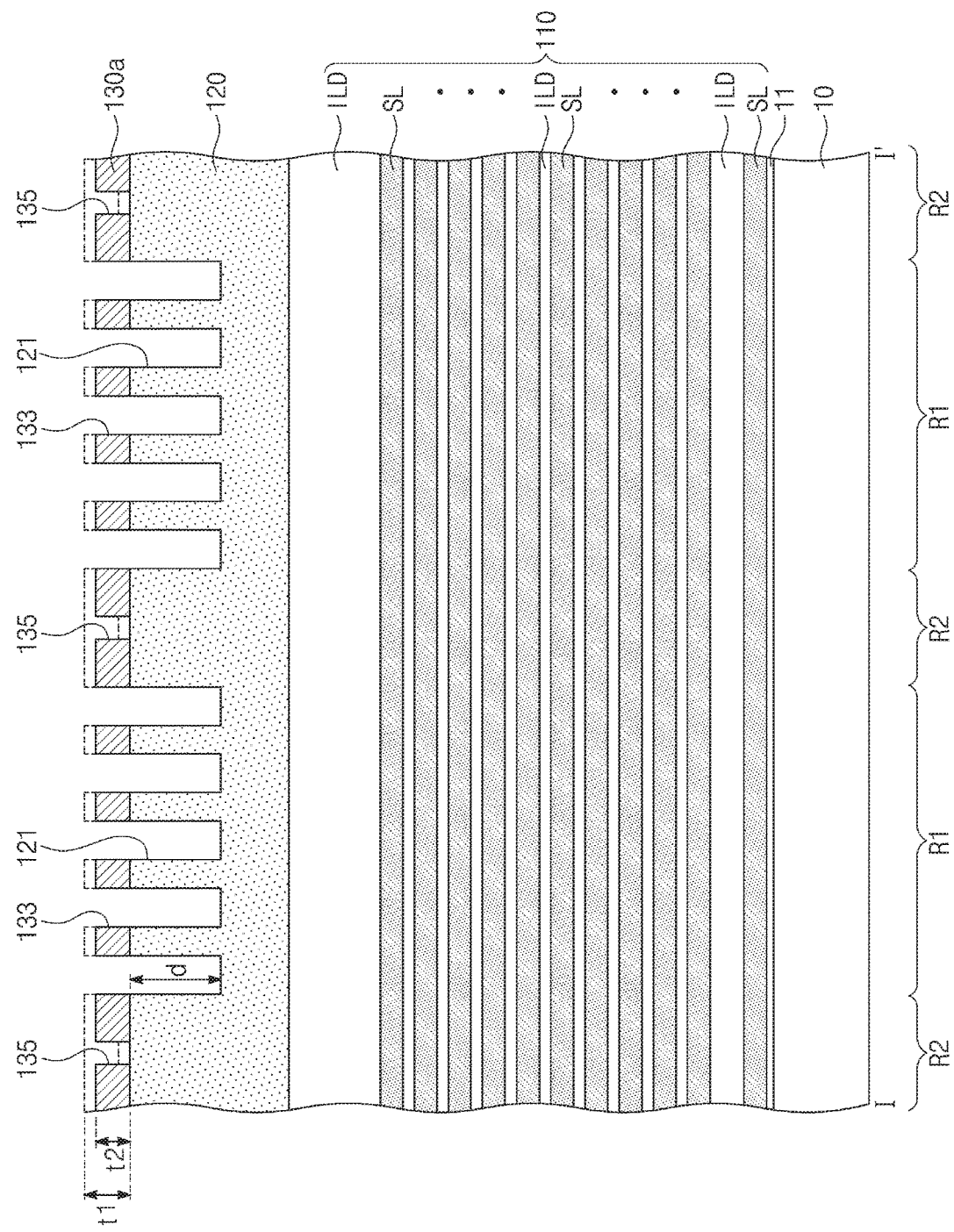

Referring to FIGS. 1 and 6, the first hardmask layer 120 may experience a first etch process in which the second hardmask pattern 130a is used as an etch mask.

In some embodiments, the first etching process may cause the first hardmask layer 120 to have preliminary mask holes 121 on the pattern regions R1, and may also cause the second hardmask pattern 130a to have second mask holes 135 on the buffer regions R2. For example, the first etching process may be performed such that the preliminary mask holes 121 may each have a depth d about 5 times greater than a thickness reduction, t1–t2, of the first hardmask layer 120 and portions of the first hardmask layer 120 may remain below the preliminary mask holes 121.

When the first etching process is performed, the second hardmask pattern 130a may be reduced in thickness. Accordingly, the second hardmask pattern 130a below the recess 131 may be etched to form second mask holes 135 to which the first hardmask layer 120 is exposed.

Figure 7:
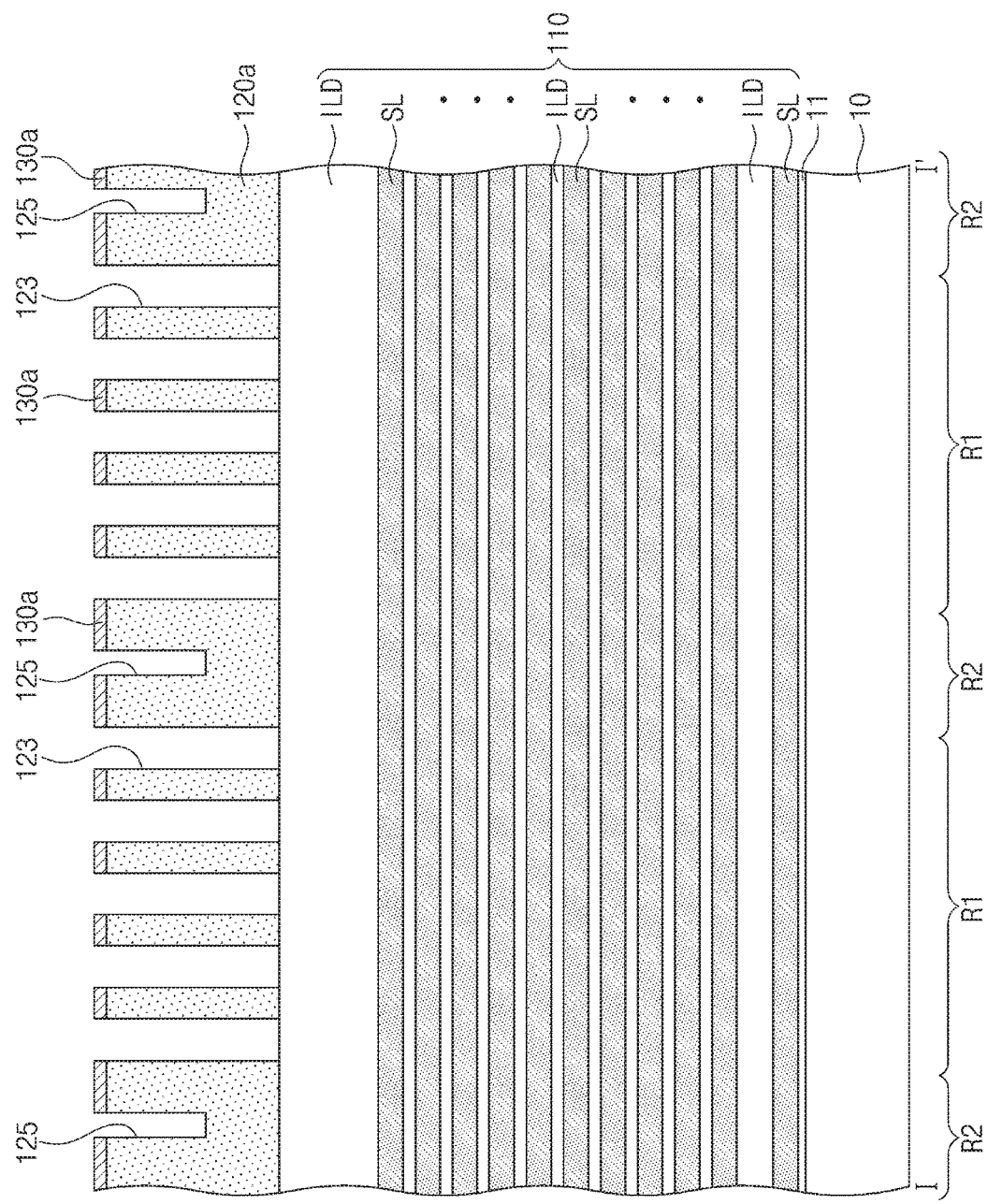

Referring to FIGS. 1 and 7, the first hardmask layer 120 may experience a second etch process in which the second hardmask pattern 130a having the first and second mask holes 133 and 135 is used as an etch mask. The first and second etching processes on the first hardmask layer 120 may be continuously performed under the same condition.

The second etching process may form a first hardmask pattern 120a including etch mask holes 123 on the pattern regions R1 and buffer mask holes 125 on the buffer regions R2. The first hardmask layer 120 may be etched on its portions exposed to the preliminary mask holes 121 during the second etching process, thereby forming the etch mask holes 123 on the patterns regions R1.

Similarly, the first hardmask layer 120 may be etched on its other portions exposed to the second mask holes 135 when the second etching process is performed, thereby forming the buffer mask holes 125 on the buffer regions R2. Since a thickness of the first hardmask layer 120 is greater on the buffer regions R2 than beneath the preliminary mask hole 121, the thin-layer structure 110 may not be exposed on the buffer regions R2 when the second etching process is performed to form the etch mask holes 123. The second hardmask pattern 130a may be reduced in thickness during the second etching process. After the first hardmask pattern 120a is formed, the second hardmask pattern 130a may be removed.

Figure 8:
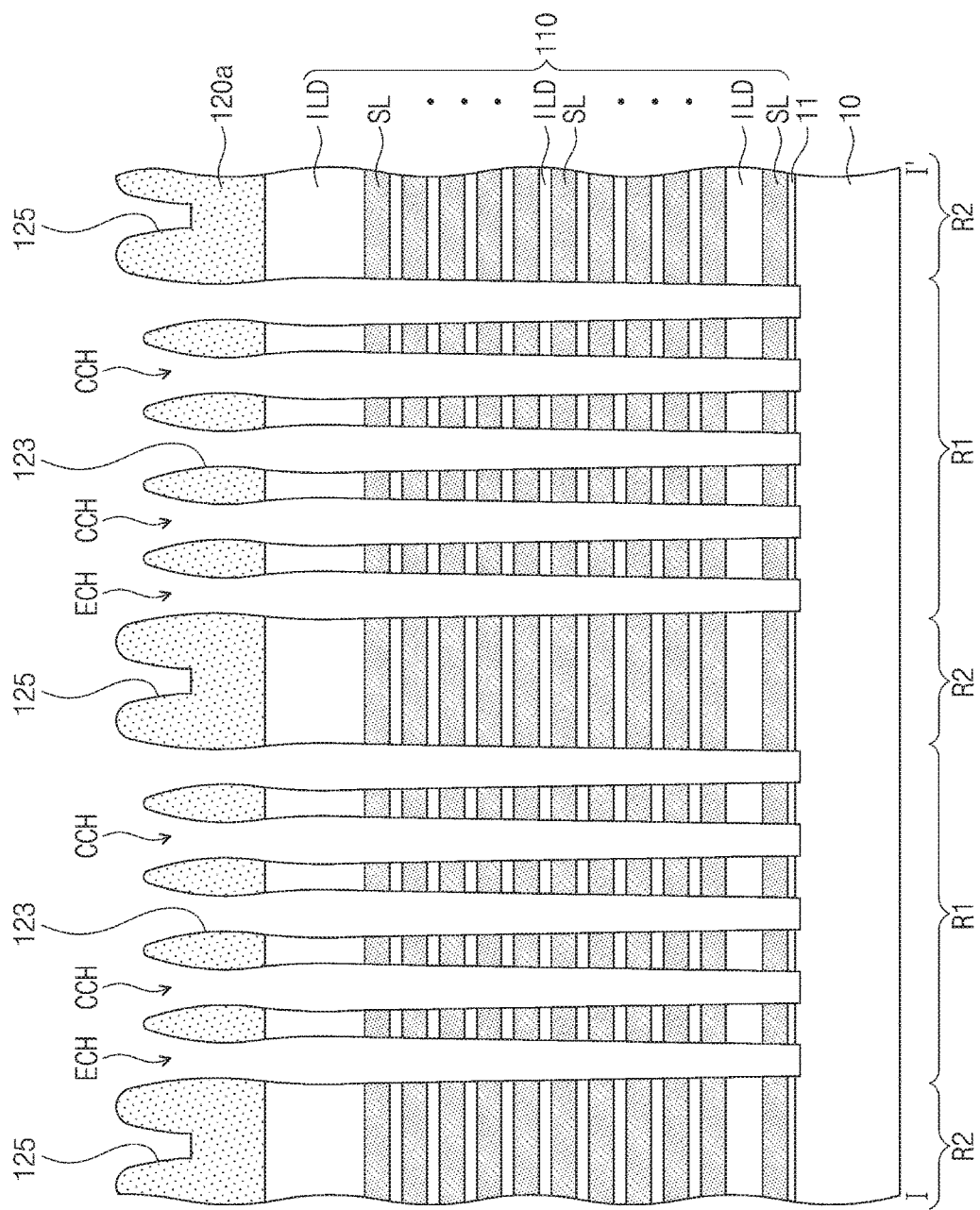

Referring to FIGS. 1 and 8, the first hardmask pattern 120a may be used as an etch mask for am etch that anisotropically etches the thin-layer structure 110 and the buffer insulation layer 11 to form edge channel holes ECH and central channel holes CCH on the pattern regions R1. The top surface of the substrate 10 may be exposed to the edge channel holes ECH and central channel holes CCH that penetrate the thin-layer structure 110 and the buffer insulation layer 11. The anisotropic etching process may cause each channel hole CH to have a lower width less than an upper width and to have an inclined inner sidewall. In addition, the anisotropic etching process may over-etch the top surface of the substrate 10, so that the substrate 10 may be recessed on the top surface exposed to the edge channel holes ECH and central channel holes CCH.

In more detail, etching ions may be generated from ionization of an etching gas used for the anisotropic etching process for forming the edge channel holes ECH and central channel holes CCH. The first hardmask pattern 120a may allow the etching ions to be scattered on sidewalk of the etch mask holes 123, so that the etching ions may concentrate on a portion of the inner sidewall of the channel hole CH. The channel hole CH may thus be increased in width on its portion. As a result, the thin-layer structure 110 may have a negatively sloped sidewall on its upper portion (e.g., on an uppermost insulation layer ILD).

In some embodiments, when the anisotropic etching process is performed to form the edge channel holes ECH and central channel holes CCH, the first hardmask pattern 120a may be decreased in thickness and the etch mask hole 123 may be increased in upper width. In some embodiments, the first hardmask pattern 120a may have a difference in etching amount depending on whether positioned on either the pattern region R1 where the etch mask holes 123 are aggregated or the buffer region R2 where the buffer mask hole 125 is formed.

For example, owing to a pattern difference between the pattern region R1 and the buffer region R2, the pattern region R1 may be provided with the etching gas whose amount is greater on its central portion than on its edge portion. Accordingly, when the anisotropic etching process is performed forming the edge channel holes ECH and central channel holes CCH, a reduction in thickness of the first hardmask pattern 120a may be greater on the pattern region R1 than on the buffer region R2. In some embodiments, since the first hardmask pattern 120a has the buffer mask hole 125 on the buffer region R2, the pattern region R1 may be etched at its central and edge portions under a similar etch condition. For example, since the buffer mask hole 125 is present on the buffer region R2, when the anisotropic etching process is performed, the etching ions provided to the etch mask holes 123 may have a reduced difference in inclination angle between the central and edge portions of the pattern region R1. The first hardmask pattern 120a may therefore have a reduced difference in thickness between the buffer region R2 and the pattern region R1. As a result, the edge channel holes ECH on the edge portions of the pattern regions R1 may be reduced or prevented from being diminished in size or being bent caused by scattered or obliquely incident etching ions. For example, the edge channel holes ECH on the edge portions of the pattern regions R1 may be only slightly, or not at all, different in size and/or shape from those of the central channel hole CCH on the central portions of the pattern regions R1.

The first hardmask pattern 120a may not be removed but remain below the buffer mask hole 125 during the anisotropic etching process for forming the edge channel holes ECH and central channel holes CCH. Accordingly, the thin-layer structure 110 may be reduced in likelihood, e.g., prevented, from being etched on the buffer regions R2 when the edge channel holes ECH and central channel holes CCH are formed.

After the edge channel holes ECH and central channel holes CCH are formed on the pattern regions R1, a process may be performed to remove the first hardmask pattern 120a.

Figure 9:
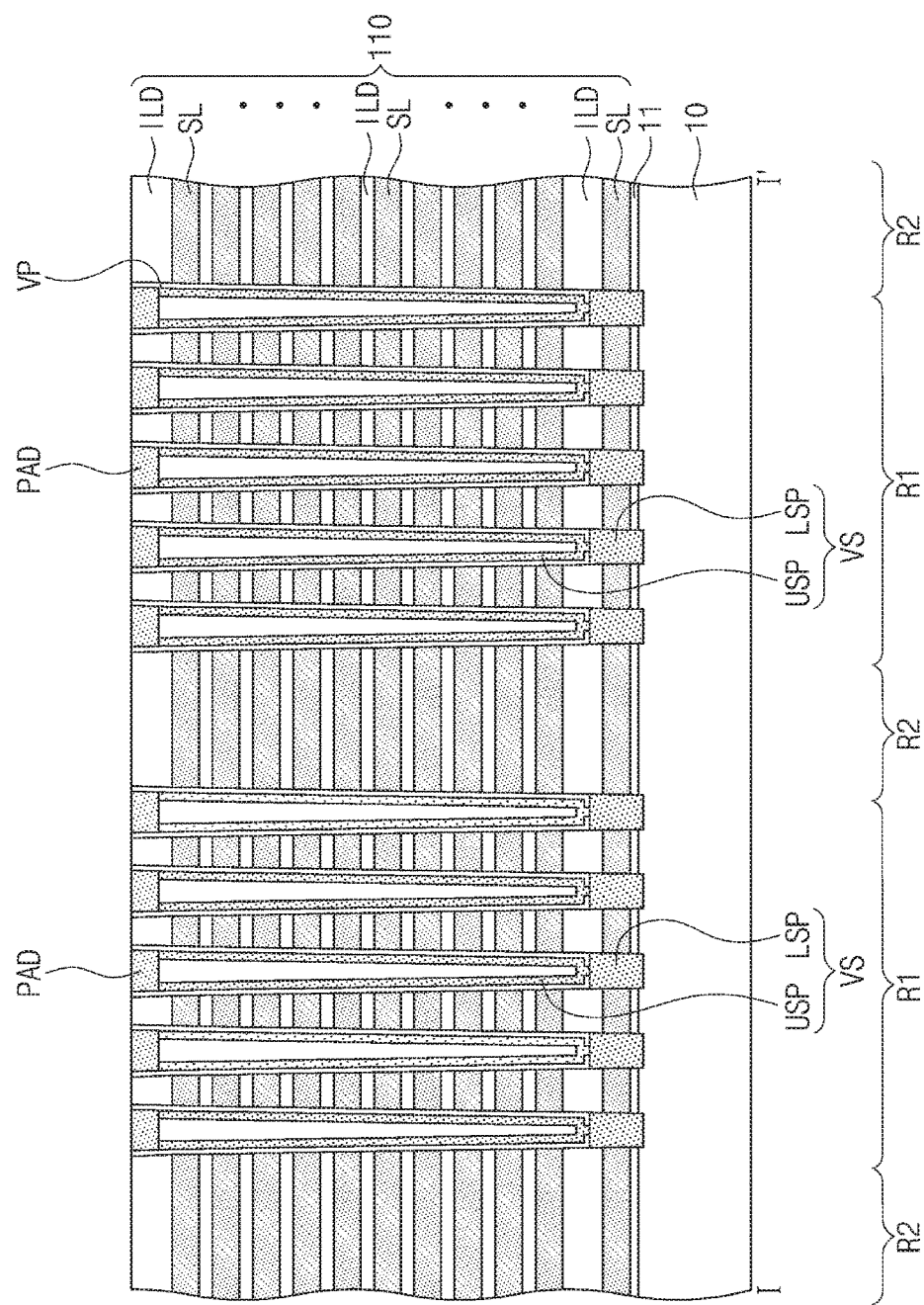

Referring to FIGS. 1 and 9, vertical structures VS may be formed in the edge channel holes ECH and central channel holes CCH. For example, the formation of the vertical structures VS may include forming in each channel hole CH a lower semiconductor pattern ESP and an upper semiconductor pattern USP.

The lower semiconductor pattern ESP may be formed by performing a selective epitaxial growth (SEG) process that uses the substrate 10 exposed to the edge channel holes ECH and central channel holes CCH as a seed layer. The lower semiconductor pattern LSP may thus be formed to have a pillar shape that fills lower portion of the channel hole CH. The lower semiconductor pattern LSP may have a top surface higher than a top surface of a lowermost one of the sacrificial layers SL.

The lower semiconductor pattern LSP may be formed of, but not d to, a single crystalline silicon or a polycrystalline silicon. For example, the lower semiconductor pattern LSP may be formed of one of carbon nanostructures, organic semiconductors, and compound semiconductors. The lower semiconductor pattern LSP may have the same conductive type as that of the substrate 10. The lower semiconductor pattern LSP may be in-situ doped with an impurity in the selective epitaxial growth process. Alternatively or additionally, an impurity may be ion-implanted into the lower semiconductor pattern LSP after its formation.

The upper semiconductor pattern USP may be formed in the channel hole CH in which the lower semiconductor pattern LSP is provided. The upper semiconductor pattern USP may be electrically connected to the lower semiconductor pattern LSP. In more detail, the upper semiconductor pattern USP may be in contact with the lower semiconductor pattern LSP and may have a macaroni or pipe shape with a closed bottom. An inside of the upper semiconductor pattern USP may be filled with an insulating material and/or air. The upper semiconductor pattern USP may be undoped or doped with an impurity whose conductive type is the same as that of the substrate 10. The upper semiconductor pattern USP may include silicon (Si), germanium (Ge), or a mixture thereof, and may be an impurity-doped semiconductor or an intrinsic semiconductor in which no impurity is doped. The upper semiconductor pattern USP may have one or more selected from a single crystalline structure, an amorphous structure, and a polycrystalline structure.

A conductive pad PAD may be formed at or on each top end of the upper semiconductor patterns USP. The conductive pad PAD may include an impurity-doped region or a conductive material.

In some example embodiments, before the upper semiconductor pattern USP is formed, the vertical insulation pattern VP may be formed in the channel hole CH. The vertical insulation pattern VP may consist of, or may include, a single thin layer or a plurality of thin layers. In some embodiments, the vertical insulation pattern VP may be a portion of a data storage layer. For example, the vertical insulation pattern VP may include a charge storage layer used as a memory element of an NAND Flash memory device. For example, the charge storage layer may be a trap insulation layer or an insulation layer including conductive nano-dots. Alternatively, the vertical insulation pattern VP may include a thin layer for a phase change memory device or a changeable resistance memory device.

Figure 10:
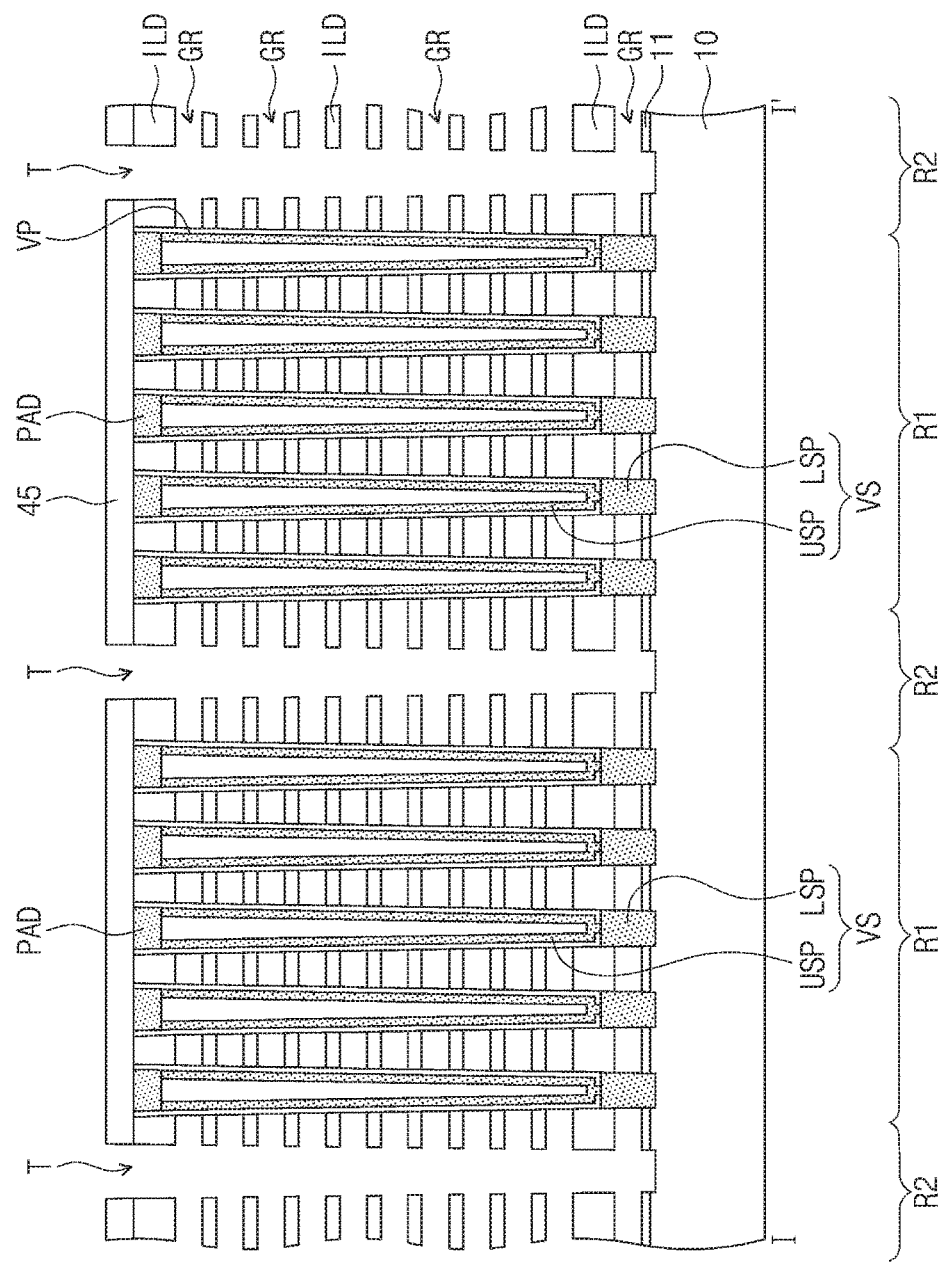

Referring to FIGS. 1 and 10, the thin-layer structure 110 may be patterned to form trenches T exposing the substrate 10. The trenches T may extend in the first direction D1 and may be spaced apart from each other in the second direction D2.

The formation of the trenches T may include forming a capping insulation layer to cover top surfaces of the vertical structures VS, forming on the capping insulation layer a mask pattern (not shown) defining planar positions of the trenches T, and using the mask pattern as an etch mask to anisotropically etch the thin-layer structure 110. The formation of the trenches T may allow the thin-layer structure 110 to have a capping insulation pattern 45 formed thereon, and also allow the sacrificial layers SL and the insulation layers ILD to reveal their sidewalls.

Processes may be performed which substitute electrodes (see EL of FIG. 11) for the sacrificial layers SL exposed to the trenches T. In more detail, gate regions GR may be formed by removing the sacrificial layers SL exposed to the trenches T. The gate regions GR may be formed by isotropically etching the sacrificial layers SL using an etch recipe having an etch selectivity to the insulation layers ILD. For example, when the sacrificial layers SL are a silicon nitride layer and the insulation layers ILD are a silicon oxide layer, an etching solution including phosphoric acid may be used to isotropically etch the sacrificial layers SL to form the gate regions GR. The gate regions GR may horizontally extend from the trenches T to expose portions of the vertical insulation pattern VP, and a lowermost one of the gate regions GR may expose a portion of the lower semiconductor pattern LSP.

Figure 11:
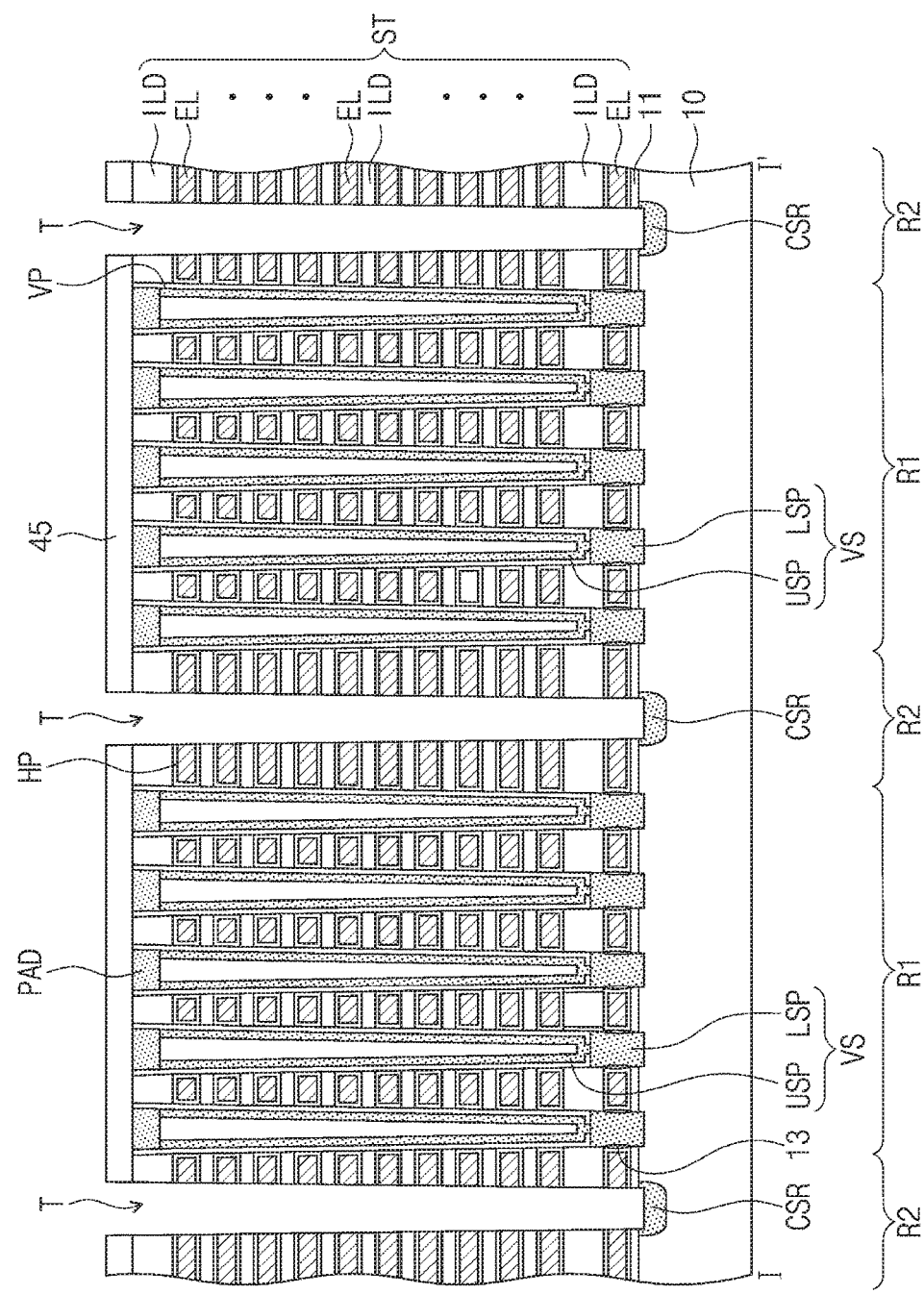

Referring to FIGS. 1 and 11, a horizontal insulation pattern HP and electrodes EL may be formed in the gate regions GR.

The formation of the horizontal insulation pattern HP and the electrodes EL may include forming a horizontal insulation layer which conformally covers the gate regions GR, forming on the horizontal insulation layer a gate conductive layer which fills the gate regions GR, and removing the gate conductive layer from the trenches T which form the electrodes EL vertically separated from each other. In addition, before the horizontal insulation pattern HP is formed, a thermal oxide layer 13 may be formed on a sidewall of the lower semiconductor pattern LSP exposed to the lowermost gate region GR. The horizontal insulation pattern HP may be a portion of a data storage layer in an NAND Flash memory transistor. Each of the electrodes EL may include a barrier metal layer and a metal layer that are deposited, e.g. sequentially deposited. The barrier metal layer may include a metal nitride layer such as TiN, TaN, or WN. The metal layer may include a metallic material such as W, Al, Ti, Co, or Cu.

The gate conductive layer may be formed using chemical vapor deposition and/or atomic layer deposition. The gate conductive layer may thus be formed on sidewalls of the trenches T and a top surface of the capping insulation pattern 45, while filling the gate regions GR. The formation of the electrodes EL may form electrode structures ST each of which includes the insulation layers ILD and the electrodes EL alternately stacked on the substrate 10. Each electrode structure ST may be constructed such that an uppermost electrode EL is separated into select electrodes SEL1 and SEL2 by an insulation pattern extending in the first direction D1 therebetween.

After the electrode structures ST are formed, common source regions CSR may be formed in the substrate 10 exposed to the trenches T. The common source regions CSR may extend in parallel in the first direction D1 and may be spaced apart from each other in the second direction D2. The common source regions CSR may be formed by doping the substrate 10 with an impurity whose conductive type is different from that of the substrate 10. The common source regions CSR may include, for example, an N-type impurity (e.g., arsenic (As) and/or phosphorous (P)).

Figure 12:
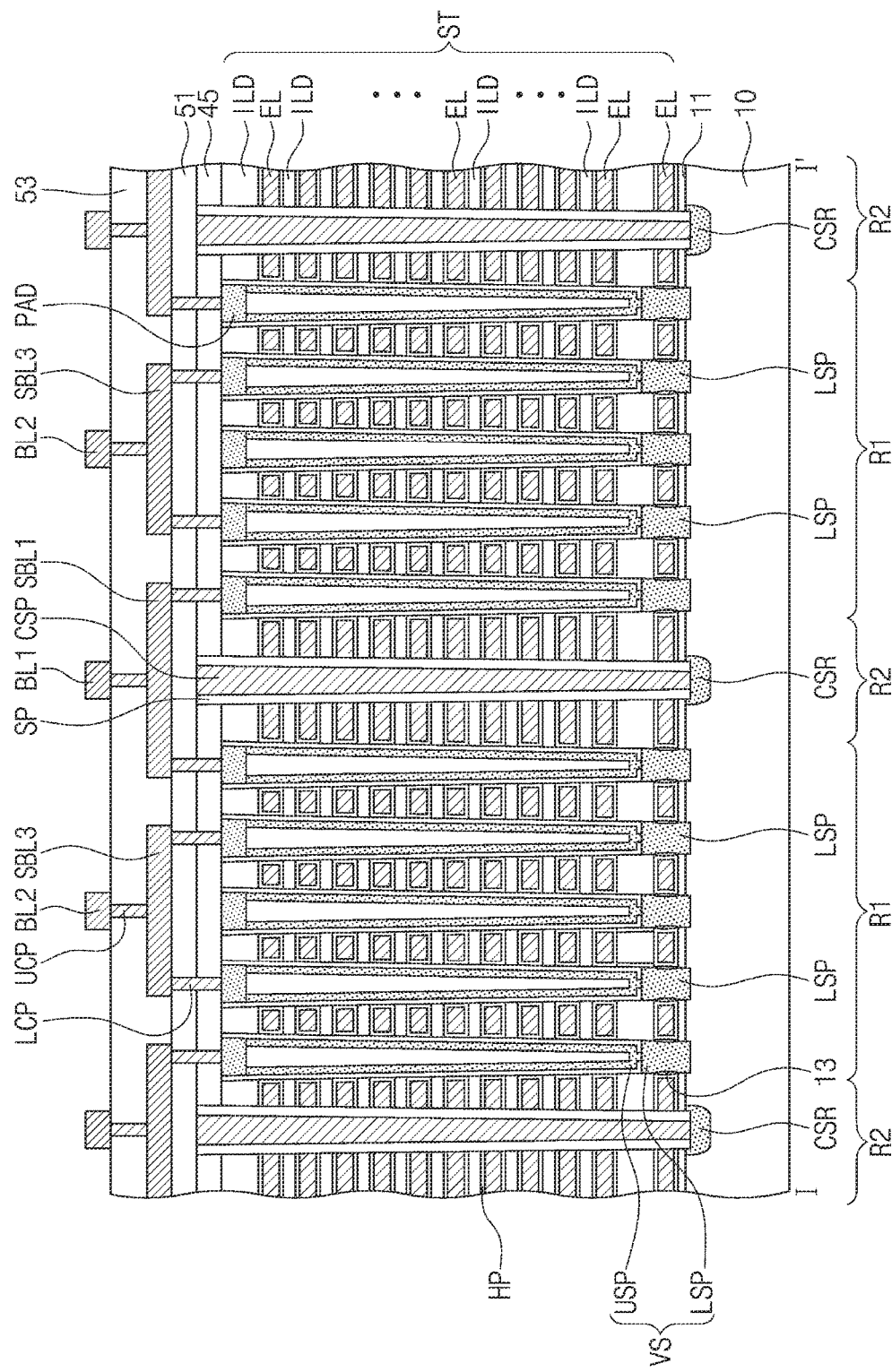

Referring to FIGS. 1 and 12, after the electrode structures ST are formed, an insulation spacer SP and a common source plug CSP may be formed in each trench T.

For example, the formation of the insulation spacer SP may include depositing a spacer layer having a uniform thickness on the substrate 10 on which the electrode structures ST are formed and then performing an etch-back process on the spacer layer to expose the common source region CSR. The insulation spacer SP may have a thickness that decreases as approaching an upper portion of the electrode structure ST from a lower portion of the electrode structure ST.

A conductive layer may be deposited to fill the trenches T in which the insulation spacers SP are formed and then planarized until the top surface of the capping insulation pattern 45 is exposed, thereby forming common source plugs CSP. A first interlayer dielectric layer 51 may be formed to cover top surfaces of the common source plugs CSP.

The first interlayer dielectric layer 51 may be provided thereon with first, second, third, and fourth subsidiary lines SBL1, SBL2, SBL3, and SBL4. The first to fourth subsidiary lines SBL1 to SBL4 may have a major axis in the second direction D2, and may be connected to two neighboring vertical structures VS through lower contacts LCP. A second interlayer dielectric layer 53 may be formed on the first interlayer dielectric layer 51.

The second interlayer dielectric layer 53 may be provided thereon with first bit lines BL1 and second bit lines BL2 that are disposed, e.g. alternately disposed, and extend in the second direction D2. The first bit lines BL1 may be connected through upper contacts UCP to the first or second subsidiary lines SBL1 or SBL2, and the second bit lines BL2 may be connected through other upper contacts UCL to the third or fourth subsidiary lines SBL3 or SBL4.

According to some example embodiments of inventive concepts, a hardmask pattern y have a reduced thickness at a space region (or a buffer region) between pattern regions where channel holes are formed to penetrate a thick thin-layer structure. Reducing a decrease in thickness between the space region and the pattern region may thus be possible.

In addition, when the channel holes are formed, the channel holes on edge portions of the pattern regions may be reduced or prevented from being deformed caused by the hardmask pattern having a large thickness remaining on the space region. Accordingly, the channel holes on the edge portions of the pattern regions may be only slightly, or not at all, different in size and/or shape from those of the channel holes on central portions of the pattern regions. As a result, a three-dimensional semiconductor device having enhanced reliability may be achieved.

Although inventive concepts have been described in connection with the embodiments of inventive concepts illustrated in the accompanying drawings, it will be understood to those skilled in the art that various changes and modifications may be made without departing from the technical spirit and essential feature of inventive concepts. It will be apparent to those skilled in the art that various substitution, modifications, and changes may be thereto without departing from the scope and spirit of the inventive concept.

What is claimed is:

1. A method of fabricating a three-dimensional semiconductor device, the method comprising:
    stacking a first hardmask layer and a second hardmask layer on a lower layer including a pattern region and a buffer region adjacent to the pattern region;
    patterning the second hardmask layer to form a second hardmask pattern including a plurality of first mask holes on the pattern region and at least one recess on the buffer region, the plurality of first mask holes exposing the first hardmask layer; and
    etching the first hardmask layer using the second hardmask pattern as an etch mask to form a first hardmask pattern including a plurality of etch mask holes on the pattern region and at least one buffer mask hole on the buffer region, the plurality of etch mask holes exposing a top surface of the lower layer, the at least one buffer mask hole having a bottom surface spaced apart from the top surface of the lower layer, wherein the first hardmask layer constitutes a single layer, and wherein, during forming the first hardmask pattern, a portion of the first hardmask pattern remains below the at least one buffer mask hole.

2. The method of claim 1, wherein the recess has a first width, and the first mask holes have a second width greater than the first width.

3. The method of claim 1, wherein the buffer mask hole has a linear shape extending in one direction.

4. The method of claim 1, wherein forming the first hardmask pattern comprises etching the recess of the second hardmask pattern to form a second mask hole exposing the first hardmask pattern.

5. The method of claim 4, wherein
the first mask holes are spaced apart from each other at a first distance, and
the second mask hole and a corresponding most adjacent one of the first mask holes are spaced apart at a second distance identical to or greater than the first distance.

6. The method of claim 1, wherein the buffer mask hole has a depth greater than a thickness of the second hardmask layer.

7. The method of claim 1, further comprising:
etching the lower layer using the first hardmask pattern as an etch mask to form through holes on the pattern region, the through holes penetrating the lower layer.

8. The method of claim 7, wherein, during forming the through holes, a portion of the first hardmask pattern remains below the buffer mask hole.

9. The method of claim 1, wherein forming the second hardmask pattern comprises:
forming a first mask pattern on the second hardmask layer, the first mask pattern including first openings on the buffer region;
etching a portion of the second hardmask layer using the first mask pattern as an etch mask to form the recess;
removing the first mask pattern;
forming a second mask pattern on the second hardmask layer, the second mask pattern filling the recess, and including second openings on the pattern region; and
etching the second hardmask layer using the second mask pattern as an etch mask to form the first mask holes.

10. A method of fabricating a three-dimensional semiconductor device, the method comprising:
providing a substrate including pattern regions and a buffer region between the pattern regions;
forming a thin-layer structure on the substrate, the thin-layer structure comprising sacrificial layers and insulation layers alternately and vertically stacked;
forming a first hardmask pattern on the thin-layer structure, the first hardmask pattern including at least one buffer mask hole on the buffer region and a plurality of etch mask holes on each of the pattern regions, the at least one buffer mask hole having a bottom surface spaced apart from a top surface of the thin-layer structure, the plurality of etch mask holes exposing the top surface of the thin-layer structure; and
anisotropically etching the thin-layer structure using the first hardmask pattern as an etch mask, wherein, during forming the first hardmask pattern, a portion of the first hardmask pattern remains below the at least one buffer mask hole.

11. The method of claim 10, wherein the buffer mask hole has a first width, and the etch mask holes have a second width greater than the first width.

12. The method of claim 10, wherein the buffer mask hole has a linear shape extending in one direction.

13. The method of claim 10, wherein the etch mask holes are arranged in a zigzag fashion along one direction.

14. The method of claim 10, wherein forming the first hardmask pattern comprises:
stacking first and second hardmask layers on the thin-layer structure;
patterning the second hardmask layer to form a second hardmask pattern including a plurality of first mask holes on the pattern region and at least one recess on the buffer region, the plurality of first mask holes exposing the first hardmask layer;
etching the first hardmask layer using the second hardmask pattern as an etch mask to form preliminary mask holes in the first hardmask layer on the pattern regions, wherein forming the preliminary mask holes comprises forming second mask holes by etching the second hardmask pattern through the recess of the second hardmask pattern; and
etching the first hardmask layer including the preliminary mask holes through the first and second mask holes of the second hardmask pattern.

15. The method of claim 10, wherein anisotropically etching the thin-layer structure comprises forming through holes on the pattern regions, the through holes penetrating the thin-layer structure and exposing the substrate.

16. The method of claim 15, further comprising:
forming vertical semiconductor patterns in corresponding through holes;
forming an opening penetrating the thin-layer structure on the buffer region;
removing the sacrificial layers exposed by the opening to form empty regions between the insulation layers, the empty regions exposing sidewalls of the vertical semiconductor patterns; and
forming gate electrodes in corresponding empty regions.

17. A method of fabricating a three-dimensional semiconductor device, the method comprising:
stacking first and second hardmask layers on a lower layer including pattern regions and a buffer region between the pattern regions;
forming a first mask pattern on the second hardmask layer, the first mask pattern including first openings on the buffer region;
etching a portion of the second hardmask layer using the first mask pattern as an etch mask to form a recession;
removing the first mask pattern;
forming a second mask pattern on the second hardmask layer, the second mask pattern filling the recession and including second openings on the pattern regions;
etching the second hardmask layer using the second mask pattern as an etch mask to form first mask holes; and
etching the first hardmask layer to form etch mask holes exposing the lower layer on the pattern regions, the second hardmask layer including the recession and the first mask holes being used as an etch mask when etching the first hardmask layer.

18. The method of claim 17, wherein the recession has a first width, and the first mask holes have a second width greater than the first width.

19. The method of claim 17, wherein the forming etch mask holes comprises:
- forming buffer mask holes below the recession on the buffer region, and wherein
- the buffer mask hole includes a bottom surface spaced apart from a top surface of the lower layer.

20. The method of claim 17, further comprising:
- anisotropically etching the lower layer using the first hardmask layer including etch mask holes formed while etching the first hardmask as an etch mask to form a plurality of through holes penetrating the lower layer; and
- forming semiconductor patterns in corresponding through holes.

* * * * *